United States Patent
Breakstone et al.

(10) Patent No.: US 10,206,297 B2
(45) Date of Patent: Feb. 12, 2019

(54) MESHED ARCHITECTURE RACKMOUNT STORAGE ASSEMBLY

(71) Applicant: Liqid Inc., Lafayette, CO (US)

(72) Inventors: Jason Breakstone, Broomfield, CO (US); Andrew R. Heyd, Longmont, CO (US); Seth Walsh, Superior, CO (US); Christopher R. Long, Colorado Springs, CO (US); Michael D. Harrington, Golden, CO (US)

(73) Assignee: Liqid Inc., Broomfield, CO (US)

( * ) Notice: Subject to any disclaimer, the term of this patent is extended or adjusted under 35 U.S.C. 154(b) by 291 days.

(21) Appl. No.: 15/359,539

(22) Filed: Nov. 22, 2016

(65) Prior Publication Data

US 2017/0150621 A1 May 25, 2017

Related U.S. Application Data

(60) Provisional application No. 62/258,756, filed on Nov. 23, 2015, provisional application No. 62/258,767, filed on Nov. 23, 2015.

(51) Int. Cl.
*H05K 5/02* (2006.01)
*G06F 13/40* (2006.01)
(Continued)

(52) U.S. Cl.
CPC ......... *H05K 5/026* (2013.01); *G06F 13/4022* (2013.01); *G06F 13/4068* (2013.01);
(Continued)

(58) Field of Classification Search
CPC .... G11B 33/128; G11B 33/142; H05K 5/026; H05K 7/1489; H05K 7/1492; H05K 7/20736
See application file for complete search history.

(56) References Cited

U.S. PATENT DOCUMENTS 6,325,636 B1 * 12/2001 Hipp .................. G06F 1/183
361/788
7,068,498 B2 * 6/2006 Bolich .................. G06F 1/184
361/752
(Continued)

FOREIGN PATENT DOCUMENTS

WO  WO-2017209456 A1 * 12/2017 ............... G06F 3/06

OTHER PUBLICATIONS

'Sun Storage 6180 Array—Hardware Installation Guide' by Sun Oracle, May 2010, Revision A. (Year: 2010).*
(Continued)

*Primary Examiner* — Steven G Snyder

(57) ABSTRACT

Systems, methods, apparatuses, and software for data systems are provided herein. In one example, a meshed computing architecture is presented that includes a midplane comprising PCIe interconnect, storage modules configured to couple to a first portion of the PCIe interconnect, controller modules configured to couple to a second portion of the PCIe interconnect, and fabric modules configured to couple to a third portion of the PCIe interconnect. The first portion of the PCIe interconnect communicatively couples each of the storage modules to each of the controller modules and each of the fabric modules, the second portion of the PCIe interconnect communicatively couples each of the controller modules to each of the fabric modules, and third portion of the PCIe interconnect communicatively couples the controller modules to each other.

20 Claims, 26 Drawing Sheets

(51) Int. Cl.
  *G06F 13/42* (2006.01)
  *H05K 7/20* (2006.01)
  *H05K 7/14* (2006.01)
  *G11B 33/12* (2006.01)
  *G11B 33/14* (2006.01)

(52) U.S. Cl.
  CPC ...... *G06F 13/4081* (2013.01); *G06F 13/4282* (2013.01); *G11B 33/128* (2013.01); *G11B 33/142* (2013.01); *H05K 7/1489* (2013.01); *H05K 7/1492* (2013.01); *H05K 7/20736* (2013.01); *G06F 2213/0026* (2013.01)

(56) References Cited

U.S. PATENT DOCUMENTS

| | | | | |
|---|---|---|---|---|
| 7,722,359 | B1* | 5/2010 | Frangioso, Jr. | H05K 7/20563 361/679.48 |
| 8,369,092 | B2* | 2/2013 | Atkins | G06F 1/187 361/727 |
| 9,001,514 | B2* | 4/2015 | Rust | H05K 7/02 361/727 |
| 9,501,110 | B2* | 11/2016 | Heyd | G06F 1/187 |
| 9,653,124 | B2* | 5/2017 | Heyd | G11B 33/128 |
| 9,655,284 | B2* | 5/2017 | Milligan | H05K 7/20145 |
| 9,684,575 | B2* | 6/2017 | Breakstone | G06F 11/2012 |
| 9,798,636 | B2* | 10/2017 | Breakstone | G06F 11/2012 |
| 10,001,819 | B2* | 6/2018 | Heyd | G11B 33/128 |
| 10,037,296 | B2* | 7/2018 | Breakstone | G06F 13/4022 |
| 2004/0233643 | A1* | 11/2004 | Bolich | G06F 1/184 361/727 |
| 2004/0253922 | A1* | 12/2004 | deBlanc | H05K 7/1451 455/41.1 |
| 2006/0067314 | A1* | 3/2006 | Ho | H04J 3/1611 370/389 |
| 2007/0047536 | A1* | 3/2007 | Scherer | H04L 49/358 370/360 |
| 2008/0240134 | A1* | 10/2008 | Gregg | H04L 49/35 370/402 |
| 2008/0259555 | A1* | 10/2008 | Bechtolsheim | G06F 13/409 361/679.4 |
| 2009/0276551 | A1* | 11/2009 | Brown | G06F 13/102 710/72 |
| 2011/0261526 | A1* | 10/2011 | Atkins | G06F 1/187 361/679.33 |
| 2011/0320861 | A1* | 12/2011 | Bayer | G06F 11/2033 714/5.11 |
| 2012/0166699 | A1* | 6/2012 | Kumar | G06F 13/385 710/306 |
| 2013/0132643 | A1* | 5/2013 | Huang | G06F 13/4022 711/103 |
| 2014/0008370 | A1* | 1/2014 | Judd | H05K 7/00 220/500 |
| 2014/0019661 | A1* | 1/2014 | Hormuth | G06F 15/17331 710/306 |
| 2014/0047166 | A1* | 2/2014 | Asnaashari | G06F 12/0246 711/103 |
| 2014/0059265 | A1* | 2/2014 | Iyer | G06F 9/5011 710/313 |
| 2014/0059266 | A1* | 2/2014 | Ben-Michael | G06F 13/385 710/313 |
| 2014/0204537 | A1* | 7/2014 | Rust | G11B 33/128 361/727 |
| 2014/0364048 | A1* | 12/2014 | Milligan | H05K 7/20736 454/184 |
| 2015/0212755 | A1* | 7/2015 | Asnaashari | G06F 3/0629 711/103 |
| 2015/0254202 | A1* | 9/2015 | McGlone | G06F 1/3278 710/316 |
| 2015/0304423 | A1* | 10/2015 | Satoyama | H04L 67/1097 709/223 |
| 2015/0355686 | A1* | 12/2015 | Heyd | G06F 1/187 361/679.31 |
| 2015/0370666 | A1* | 12/2015 | Breakstone | G06F 11/2012 714/6.3 |
| 2015/0370742 | A1* | 12/2015 | Breakstone | G06F 11/2012 710/313 |
| 2015/0373115 | A1* | 12/2015 | Breakstone | G06F 11/2012 709/217 |
| 2016/0073544 | A1* | 3/2016 | Heyd | G11B 33/128 361/679.31 |
| 2016/0179734 | A1* | 6/2016 | Shih | G06F 13/4081 710/302 |
| 2017/0102874 | A1* | 4/2017 | Ouchi | G06F 3/06 |
| 2017/0228336 | A1* | 8/2017 | Breakstone | G06F 13/4022 |
| 2017/0235347 | A1* | 8/2017 | Heyd | G11B 33/128 361/679.31 |
| 2017/0262029 | A1* | 9/2017 | Nelson | G06F 1/20 |
| 2017/0269871 | A1* | 9/2017 | Khan | G06F 3/0619 |
| 2017/0270069 | A1* | 9/2017 | Breakstone | G06F 13/4022 |
| 2017/0286243 | A1* | 10/2017 | Breakstone | G06F 11/2012 |
| 2017/0357609 | A1* | 12/2017 | Long | G06F 13/16 |

OTHER PUBLICATIONS

'Sun StorEdge 3310 SCSI Array—Just the Facts' copyright 2002 by Sun Microsystems, Inc. (Year: 2002).*
'VersaStack for Data Center with All Flash Storage Design Guide' by Cisco, Nov. 24, 2015. (Year: 2015).*
'PS6500 Storage Arrays—Rack Mount Instructions' copyright 2010 by Dell, Inc. (Year: 2010).*
'PS6500 Storage Arrays—Hardware Maintenance' copyright 2010 by Dell, Inc. (Year: 2010).*
International Application No. PCT/US2016/063524, International Search Report & Written Opinion, 7 pages, dated Mar. 27, 2017.

* cited by examiner

MESHED ARCHITECTURE RACKMOUNT STORAGE ASSEMBLY

RELATED APPLICATIONS

This patent application is related to claims the benefit of priority to U.S. Provisional Patent Application No. 62/258,767, entitled "MESHED PCIe STORAGE ARCHITECTURE," filed on Nov. 23, 2015, and U.S. Provisional Patent Application No. 62/258,756, entitled "DUAL-SIDED 1 U RACKMOUNT STORAGE ASSEMBLY," filed on Nov. 23, 2015, which are hereby incorporated by reference into this patent application.

BACKGROUND

Computer systems typically include bulk storage systems, such as magnetic disk drives, optical storage devices, tape drives, or solid state storage drives, among other storage systems. As storage needs have increased in these computer systems, networked storage systems have been introduced which store large amounts of data in a storage environment physically separate from end user computer devices. These networked storage systems typically provide access to bulk data storage over one or more network interfaces to end users or other external systems. In addition to storage of data, remote computing systems include various processing systems that can provide remote computing resources to end users. These networked storage systems and remote computing systems can be included in high-density installations, such as rack-mounted environments.

However, as the densities of networked storage systems and remote computing systems increase, various physical limitations can be reached. These limitations include density limitations based on the underlying storage technology, such as in the example of large arrays of rotating magnetic media storage systems. These limitations can also include computing density limitations based on the various physical space requirements for network interconnect as well as the large space requirements for environmental climate control systems.

In addition to physical space limitations, these bulk storage systems have been traditionally limited in the number of devices that can be included per host, which can be problematic in storage environments where higher capacity, redundancy, and reliability is desired. These shortcomings can be especially pronounced with the increasing data storage and retrieval needs in networked, cloud, and enterprise environments.

In rack-mounted environments, densities of associated computing and storage resources can also be limited by the mechanical restrictions of backplane-centric assemblies. Typically, one or more cooling or ventilation fans are employed in rack-mounted assemblies which are mounted in at the back or rear of the assemblies, often behind any associated backplane. This configuration prevents full use of the modular volume of a rack-mounted assembly, which limits the density of components therein and the efficiency of ventilation fans.

Overview

Systems, methods, apparatuses, and software for data systems are provided herein. In one example, a meshed computing architecture is presented that includes a midplane comprising PCIe interconnect, storage modules configured to couple to a first portion of the PCIe interconnect, controller modules configured to couple to a second portion of the PCIe interconnect, and fabric modules configured to couple to a third portion of the PCIe interconnect. The first portion of the PCIe interconnect communicatively couples each of the storage modules to each of the controller modules and each of the fabric modules, the second portion of the PCIe interconnect communicatively couples each of the controller modules to each of the fabric modules, and third portion of the PCIe interconnect communicatively couples the controller modules to each other.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

The various examples herein illustrate a storage assembly which includes various storage elements, processing elements, and communication elements. These various elements are included in modular assemblies which can be housed in an associated enclosure/chassis configuration.

Additionally, a mid-mounted interconnect and ventilation system is employed as a "midplane" which advantageously allows for both front and rear mounted modular assemblies. Ventilation fans are also mounted in this midplane portion of the storage assembly, which allows for more efficient cooling of this high-density modular arrangement. In the examples below, the various modules and elements of various storage assemblies are shown.

Figure 1:
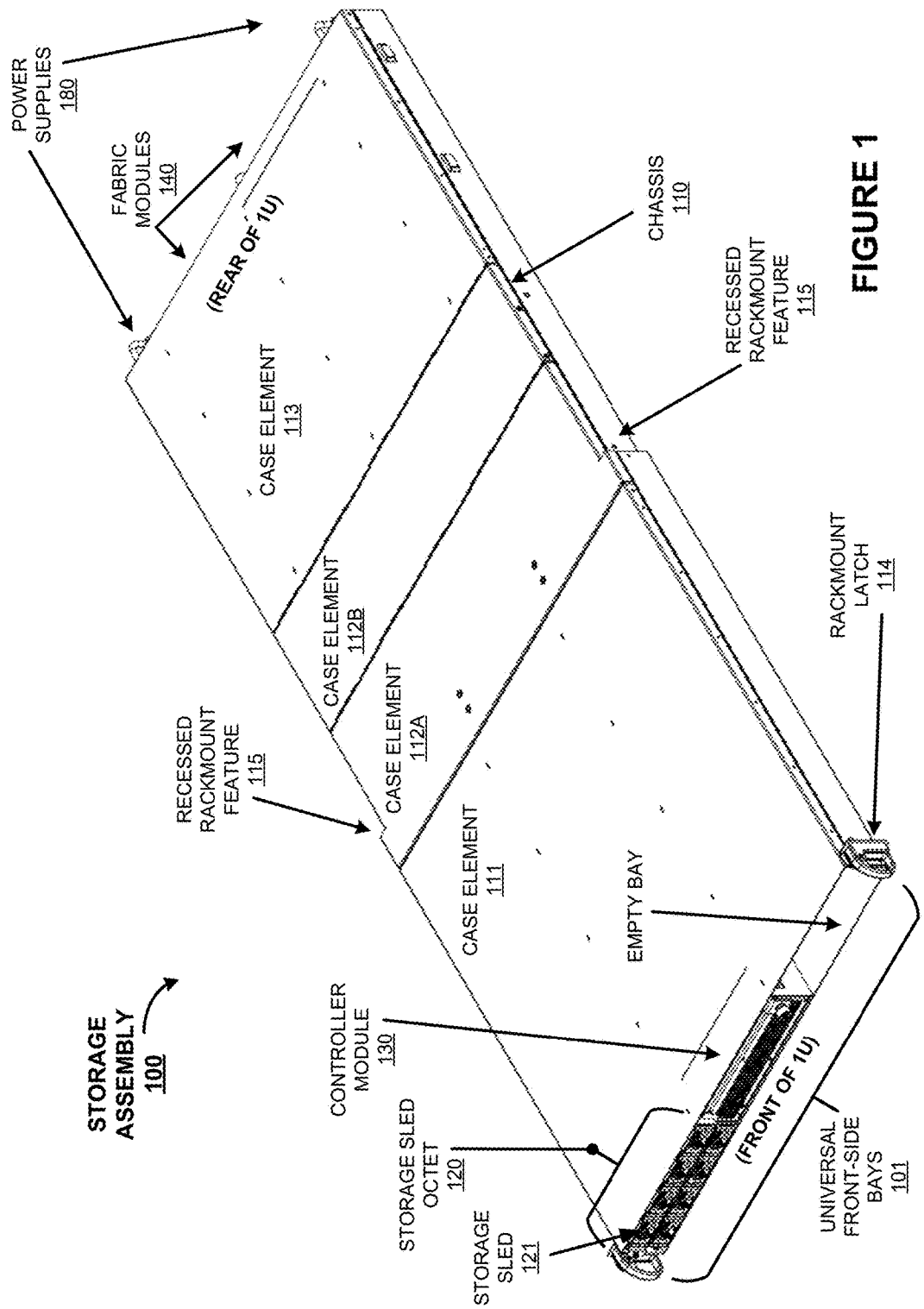
FIG. 1 is a diagram illustrating a storage assembly.
Figure 15:
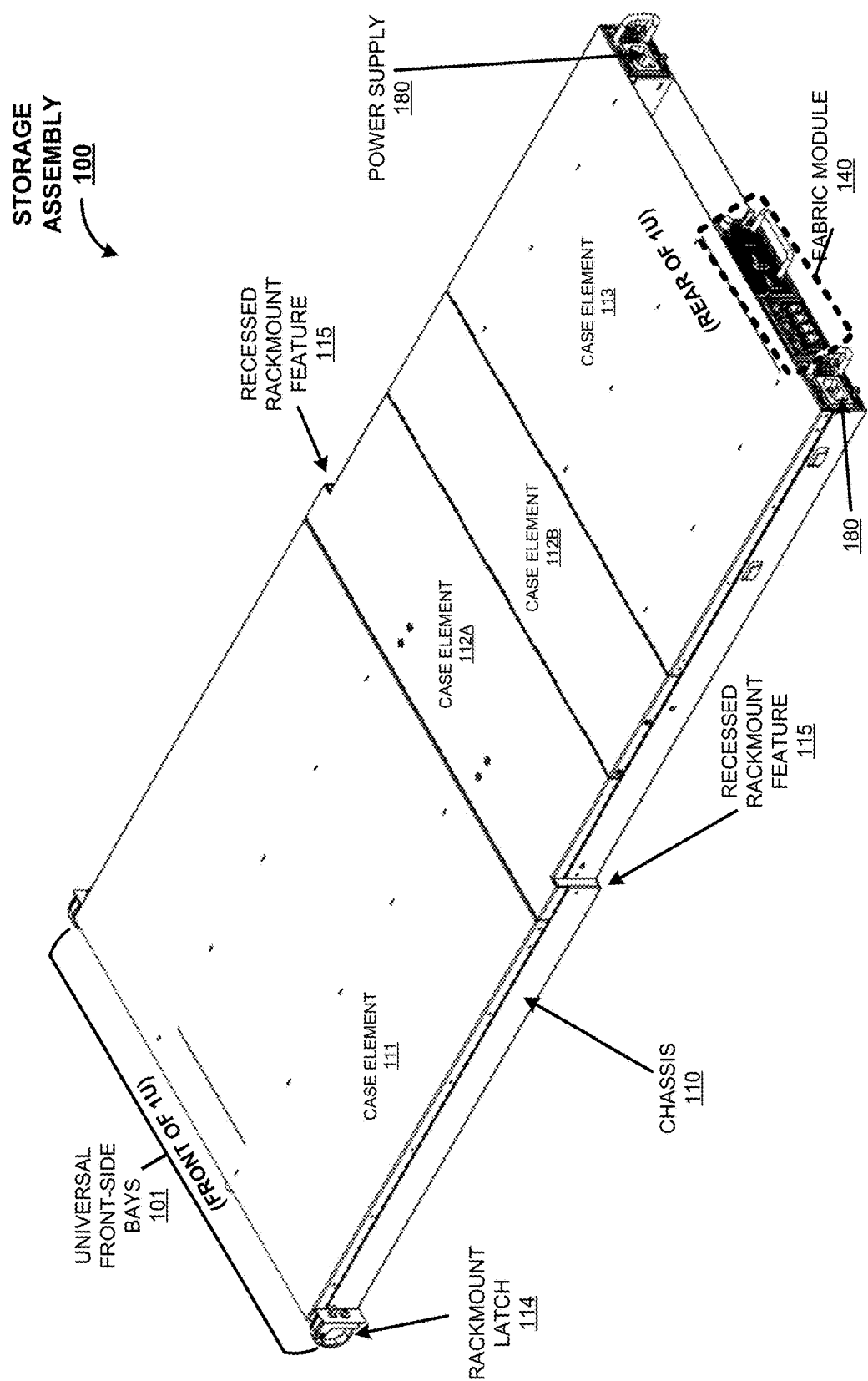
FIG. 15 is a diagram illustrating a storage assembly.

As a first example, FIG. 1 is provided. FIG. 1 is a diagram illustrating storage assembly 100, with an isometric view of a "front" side of storage assembly 100. An isometric "rear" view of storage assembly 100 is shown in FIG. 15. Storage assembly 100 comprises a plurality of different modular elements which can be employed for storage of digital data, processing of digital data, input/output (I/O) of various digital data, among other control features. In many examples, storage assembly 100 comprises a 1 U-height rackmount assembly, although variations are possible.

Storage assembly 100 includes at least one chassis element 110 which provides a structure for various modules to interconnect and for mounting into a rack or shelf system. Chassis element 110 also provides a structure for various enclosure elements, such as case elements 111-113. The mechanical and structural elements of the chassis, casing, brackets, and mounts of storage assembly 100 and associated mechanical and structural elements can comprise machined, forged, cast, extruded, or other manufactured elements. These elements can be made of metals, metallic compounds, polymers, plastics, ceramics, or other materials, including combinations and variations thereof.

In one end of storage assembly 100, universal front-side bays 101 are employed, which in this example can hold any arrangement of up to three total controller modules 130 or storage sled octets 120. Rear bays can hold interconnect modules referred to herein as fabric modules 140, which are discussed in more detail in FIG. 15. Storage sleds are inserted to form a storage array in octet physical arrangements, such as shown by storage sled octet 120. Controller modules 130 and storage sled octets 120 couple electrically and mechanically to various connectors and associated mechanical features that comprise a midplane that is located generally in the center of storage assembly 100, and covered by case elements 112A-112B. Rear bays of storage assembly 100 can house fabric module 140 and power supplies 180. Each of the modular elements of storage assembly 100 couple electrically and mechanically to various connectors and associated mechanical features of the midplane.

Each case element 111-113 in FIG. 1 forms an enclosure over the associated portion of assembly 100 and couples to fastening elements of chassis 110. Case element 111 covers the storage sleds and controller modules, case elements 112A-112B cover the midplane area and mid-mounted fans, and case element 113 covers the rear interconnect modules and power supplies. Rackmount latch 114 is employed to latch assembly 100 into associated mating features in a rackmount assembly/shelf or rack environment. Various handles can be employed on each module to insert and remove the associated module, and various handles can be employed on chassis 110 to insert and remove assembly 100 from an associated rack, such as shown for rackmount latches 114.

Recessed rackmount features 115 is included to couple to a rail system which is used to secure chassis 110 into a rackmount system or rack. A dual-rail system is included in FIGS. 4 and 5 which allows for a full-width front portion of the 1 U assembly while still providing for roll-out of assembly 100 from an associated rack to service mid-mounted fans.

Figure 2:
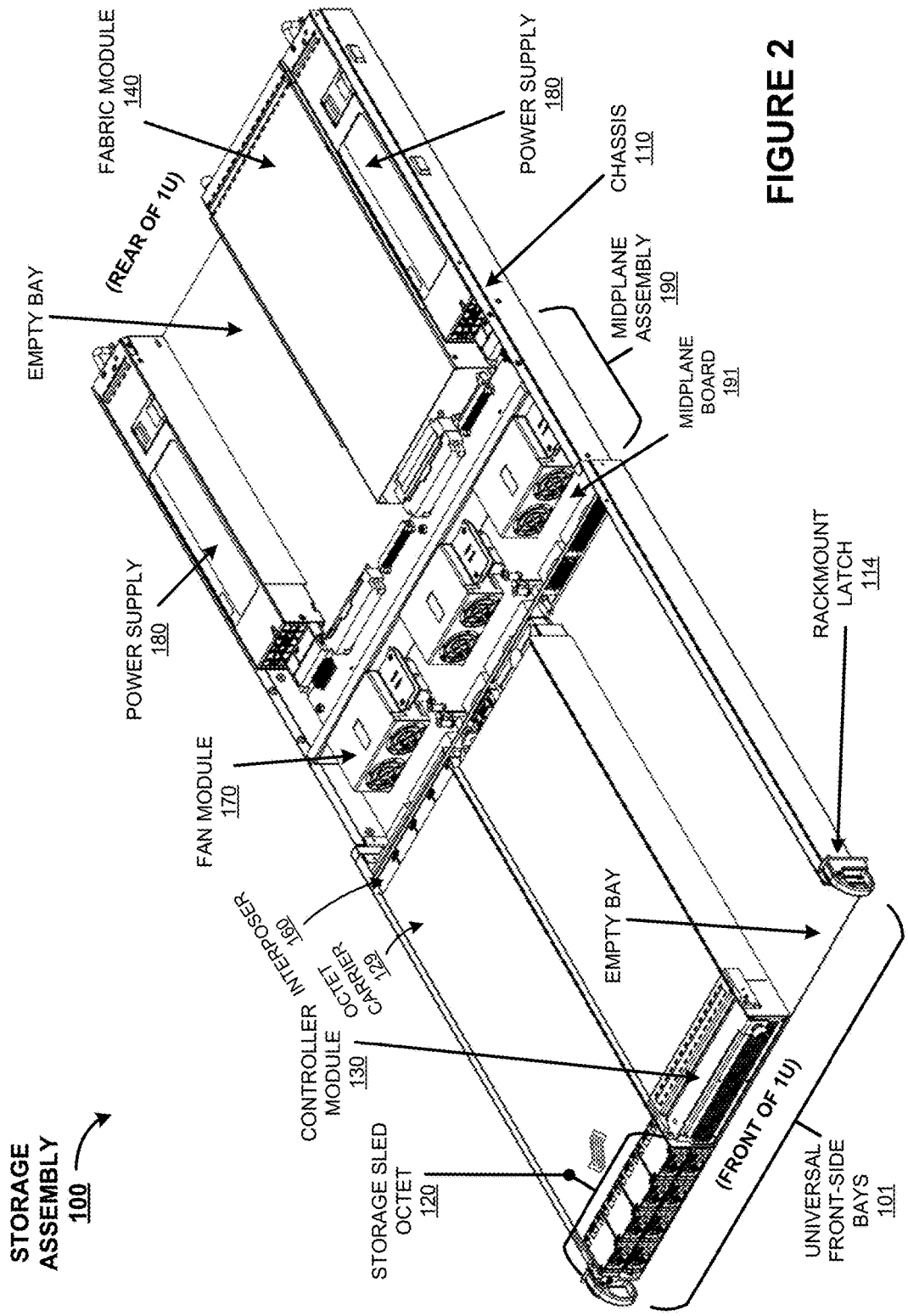
FIG. 2 is a diagram illustrating a storage assembly.

FIG. 2 shows storage assembly 100 with case elements 111-113 removed. Storage sled octet 120 and controller module 130 are visible and populate the front end of storage assembly 100, with an empty front bay shown that can hold a further storage sled octet 120 or controller module 130. One fabric module 140 and two power supplies 180 populate the rear end of storage assembly 100, and a further view of the rear end is shown in FIG. 15. Each of the modules are inserted into assembly 100 and mated to midplane assembly 190. Midplane assembly 190 provides midplane circuit board 191 for electrically interconnecting the various modular elements of storage assembly 100. Midplane assembly 190 also includes various cutouts into which fan modules 170 can be inserted. Fan modules 170 provide forced air cooling for the elements of storage assembly 100. Various partitions or baffles can be employed between each fan employed, and each fan can have associated ducts or apertures for airflow through midplane assembly 190 to the various modules.

Midplane assembly 190 includes one main printed circuit board, namely midplane board 191. As will be seen below in FIG. 22, a small adjunct printed circuit board 2022 can also be included. Front modules, such as those in front-side bays 101, plug into the front side of the midplane board 191. Rear modules, such as modules 140 and 180, plug into the rear side of midplane board 191. Fan modules 170 are mid-mounted in assembly 100 and positioned into cutouts in midplane board 191. Midplane board 191 provides electrical connections that electrically couple both front connectors and rear connectors.

Also visible in FIG. 2 is interposer 160. Each storage sled octet 120 includes an interposer assembly to couple storage sleds to midplane board 191. Interposer 160 can include connectors and circuitry which allows for intercommunication of the storage sleds with other modules, such as control and processing elements of storage assembly 100. Interposer 160 enables universal or common connectors to be employed for both the storage sled octet modules and the controller modules, which advantageously provide interchangeability among any of the universal front-side bays 101. This interchangeability allows a user to dynamically include variable numbers of storage sled octet modules and controller modules to tailor storage assembly 100 to processing performance or storage performance desires.

Figure 3:
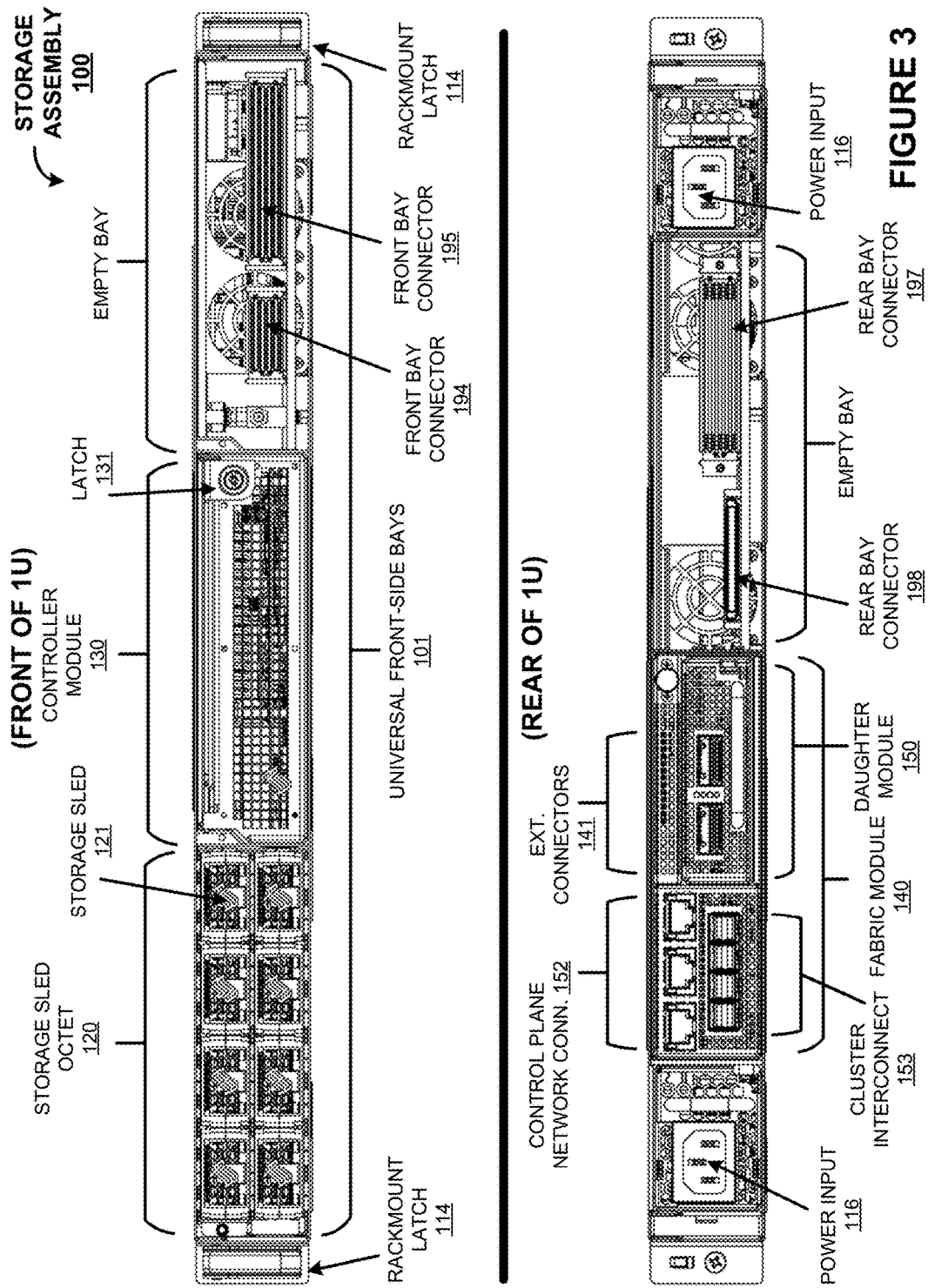
FIG. 3 is a diagram illustrating views of a storage assembly.

FIG. 3 shows two end views of storage assembly 100, namely a "front" view of storage assembly 100 and a "rear" view. Turning first to the front view in FIG. 3, one storage sled octet 120 and one controller module 130 is inserted, with an empty front bay shown that can hold a further storage sled octet 120 or controller module 130. These modules are inserted into ones of the universal front-side bays 101 of storage assembly 100. Other configuration of modules can be employed, such as three controller modules, or more than one empty bay. The flexible configuration among controller modules and storage sled octets in storage assembly 100 is provided by the universal front-side bays 101. Each bay can accept any controller module and storage sled octet, and the bays can have any configuration of controller modules and storage sled octets. If more storage resources are desired, then more storage sled octets can be inserted into storage assembly 100, whereas if more processing resources are desired, then more controller modules can be inserted into storage assembly 100. Empty bays are possible, and hot-plugging of the various modules is also allowed. Balanced configurations, such as an equal mix of controller modules and storage sled octets, can also be achieved. In this manner, storage assembly 100 can be customized on-the-fly to adapt to storage or processing needs of a data center.

In FIG. 3, one storage sled octets 120 and one controller module 130 are employed. These modules are inserted into ones of the universal front-side bays 101 of storage assembly 100. Since each storage sled octet includes eight storage sleds, then 8 storage sleds are included in the configuration illustrated in FIG. 3. As discussed below in FIG. 10, each storage sled 121 includes up to four solid state drives (SSDs). Thus, in the configuration shown in FIG. 3, a total of 32 SSDs drives are employed (e.g. 4 SSDs per storage sled, 8 storage sleds per octet, 1 octet installed). If 500 gigabyte (GB) SSDs are employed, then a total of 16 terabytes (TB) or storage can be provided by storage assembly 100 in a 1 U modular configuration. Although SSDs are discussed herein, it should be understood than any storage drive might be employed, such as hard disk drives (HDD), flash drives, optical storage drives, magnetic storage drives, resistive memory storage drives, phase change storage drives, hybrid storage drives, or other storage drives, including combinations thereof.

Additionally, each controller module 130 includes two processing systems comprising central processing units (CPUs), which can comprise Intel, AMD, or ARM CPUs, among other varieties with any number of processing cores employed per CPU. The processing systems can comprise system-on-a-board or system-on-a-chip assemblies which comprise one or more CPUs, RAM (such as DRAM), and interfacing elements (such as PCIe interfaces, network interfaces, or other communication interfaces). These two processing systems can be seen in FIG. 12, although a different number of processing systems per controller module is possible.

Also visible in FIG. 3 is latch 131, which is employed on each controller module 130. Latch 131 is discussed in more detail in FIGS. 13-14 below. Latch 131 provides for a large leverage force to be applied during insertion of controller module 131 into mating connectors of midplane board 191. In the examples herein, two connectors are employed on each controller module 130 which mate to corresponding connectors on midplane board 191. Latch 131 also provides for a precision insertion of the controller modules into the connectors of the midplane which employ tight tolerances and short or small wipe connectors to minimize signal losses and signal integrity problems from connector-to-connector coupling.

Turing now to the rear view in FIG. 3, one fabric module 140 is inserted, with an empty rear bay shown that can hold a further fabric module 140. These modules are inserted into ones of the rear-side bays of storage assembly 100. If more I/O resources or further redundancy is desired, then more fabric modules can be inserted into storage assembly 100. Empty bays are possible, and hot-plugging of the various fabric modules is also allowed. In this manner, storage assembly 100 can be customized on-the-fly to adapt to interconnect, I/O, or communication redundancy needs of a data center.

Fabric module 140 includes daughter module 150. Fabric module includes one or more circuit boards and external connectors which are communicatively coupled via PCIe interfaces over rear bay connectors 197-198 to midplane assembly 190. Furthermore, fabric module 140 acts as a carrier or dock for daughter module 150 which also connects to midplane assembly 190 via a PCIe interface. Thus, daughter module 150 is separately removable from fabric module 140 while fabric module 140 remains inserted into assembly 100. When daughter module 150 is removed, the functionality of fabric module 140 is not affected and I/O associated with fabric module 140 can continue. Daughter module 150 provides for more flexibility in interfaces, as daughter module can incorporate any number of external interfaces, such as Ethernet, iSCSI, PCIe, FiberChannel, Infiniband, USB, or other interfaces. Thus, while fabric module 140 can provide for consistent communications over connections 152-153, daughter module 150 can be removed and swapped with different interfaces or swapped independently of fabric module 140 when failures occur to daughter module 150. In some cases, daughter module 150 is not employed, and an empty bay for a daughter module remains in fabric module 140, with any associated cover plates or ventilation covers. A further discussion of fabric module 140 is included in FIG. 16.

Fabric module 140 comprises one or more communication interfaces via external connectors for communicatively coupling modules of storage assembly 100 to other storage assemblies, network links, user interfaces, or other elements. Fabric module 140 communicatively couples the selected external interfaces to midplane assembly 190. For example, cluster interconnect 153 can comprise a PCIe fabric module that couples a PCIe fabric of storage assembly 100 to other storage systems or processing systems, such as other ones of storage assemblies 100. In PCIe examples, cluster interconnect 153 (seen in FIG. 3) can comprise mini-SAS HD jacks over which PCIe signaling is carried when associated mini-SAS HD cables are employed. Mini-SAS HD ports can be employed for cluster interconnect 153 that drive 12 Gb/s, which can support PCIe Gen 3 traffic.

Fabric module 140 also provides further external interfaces for storage assembly 100. As seen in FIGS. 3 and 15, these interfaces comprise Ethernet jacks for control plane network connections 152. The Ethernet jacks can support 10 Gigabit Ethernet (10 GbE), among other throughputs.

Daughter module 150 can comprise one or more network interface cards (NICs) which can couple to PCIe interfaces, and when mated into fabric module 140, connects to the midplane. Daughter module 150 can provide further external connectors 141 comprise Quad Small Form Factor Pluggable (QSFFP) or QSFP/QSFP+ jacks carrying at least 40 GbE signaling for interfacing with external host computing systems, the Internet, or other networked devices. In many examples, fabric module 140 allows for connection of storage assembly 100 to one or more networks for receipt and transfer of storage operations, such as with end users or other server/computing equipment. When Ethernet interfaces are employed, associated Ethernet jacks can support 40 Gigabit Ethernet (40 GbE), among other throughputs. Further external interfaces can include PCIe connections, Ethernet connections, FiberChannel connections, administrative console connections, sideband interfaces such as USB, RS-232, video interfaces such as video graphics array (VGA), high-density media interface (HDMI), digital video interface (DVI), among others, such as keyboard/mouse connections.

Figure 4:
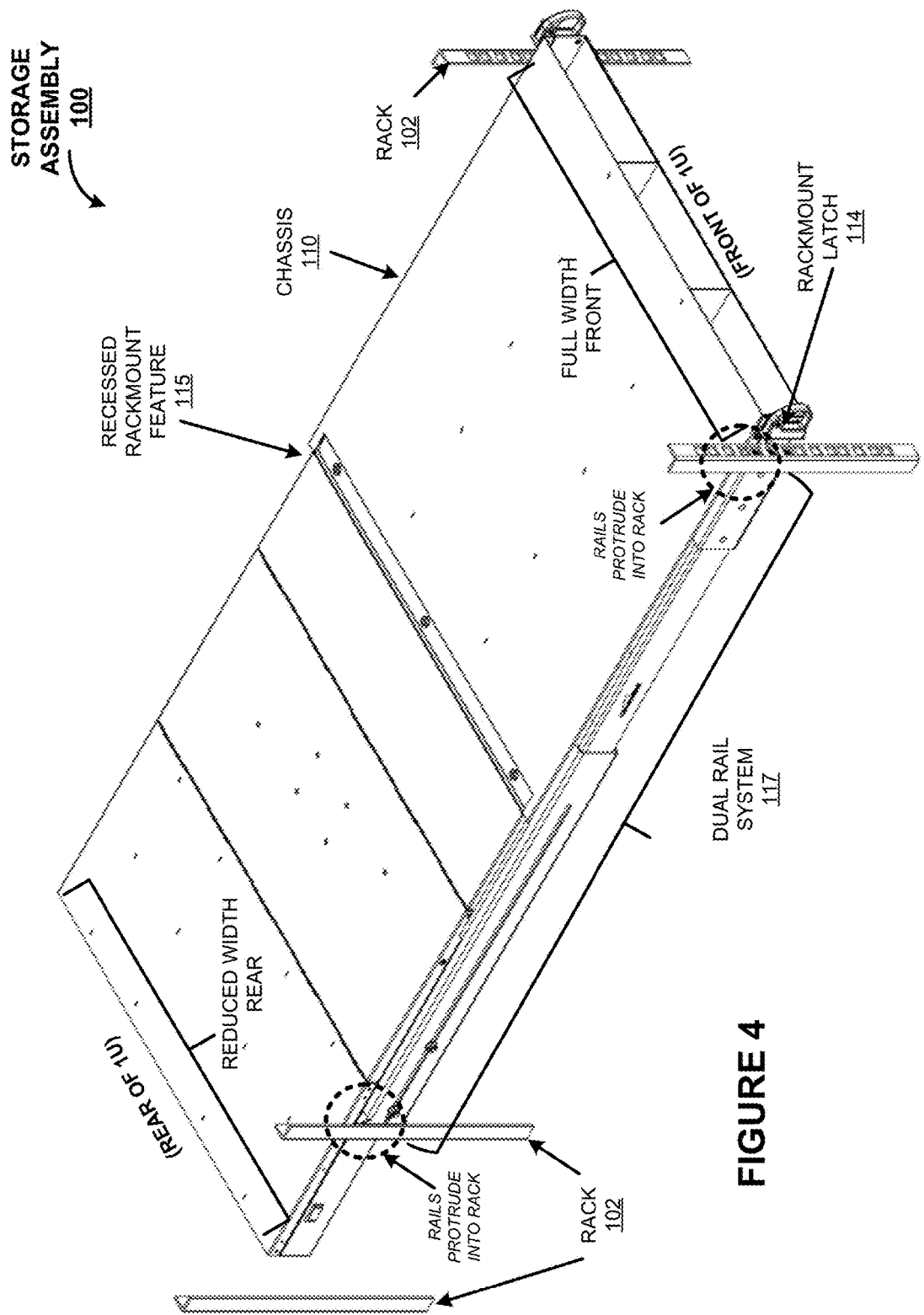
FIG. 4 is a diagram illustrating a storage assembly.
Figure 5:
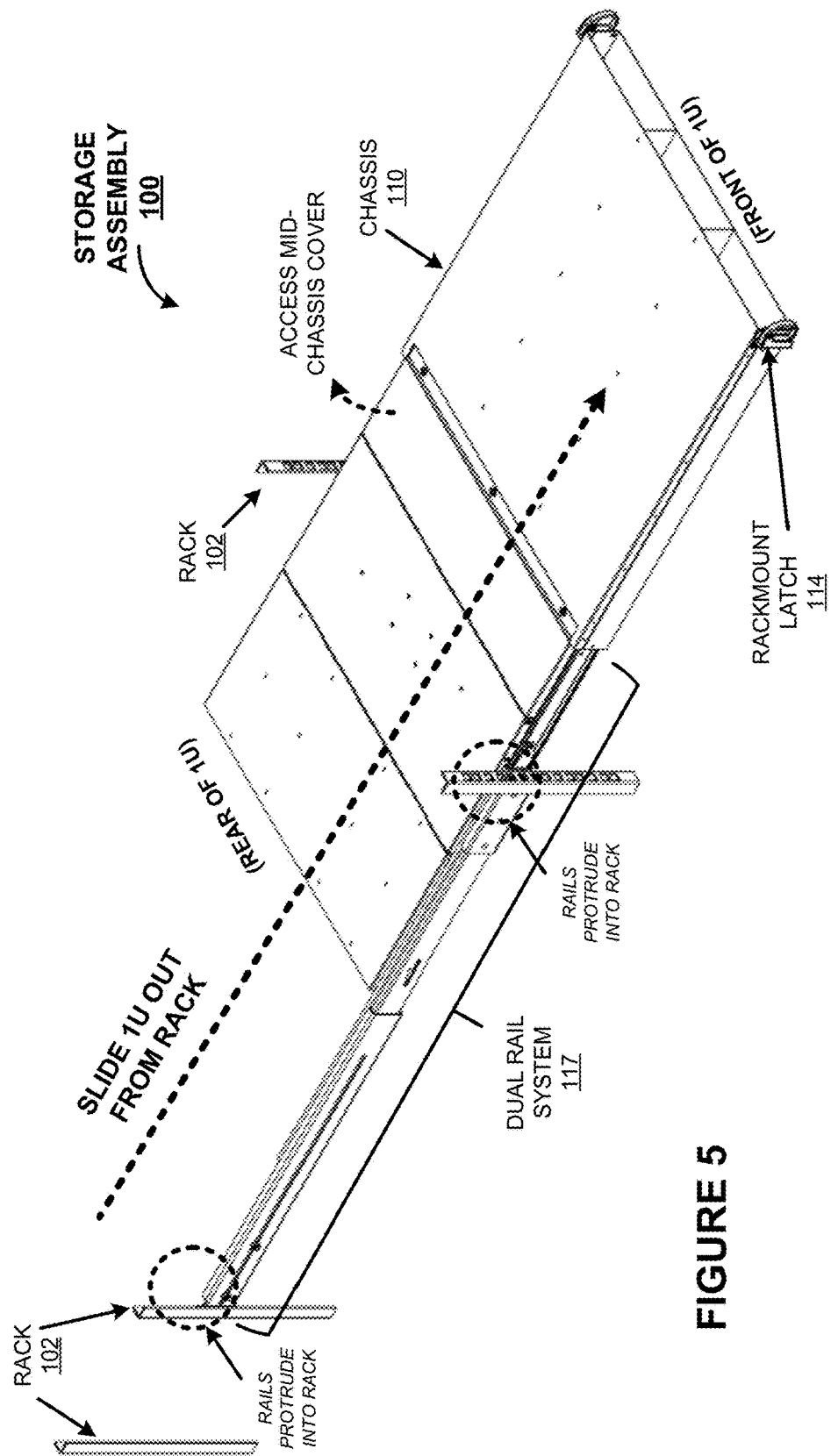
FIG. 5 is a diagram illustrating a storage assembly.

FIGS. 4-5 are diagrams illustrating storage assembly 100, focusing on the rail system 117 employed to mount storage assembly 100 into a rackmount system. FIG. 4 shows assembly 100 positioned into rack 102, while FIG. 5 shows assembly 100 slid out and dual rail systems 117 extended using the telescoping function of dual rail systems 117. A user can access mid-chassis covers as noted above when assembly 100 is slid out of rack 102.

The rackmount system can include one or more vertical members indicated by rack element 102 in FIG. 4. Two dual rail systems 117 are employed, one on each side of assembly 100. Each dual rail system 117 is mounted to assembly 100 in a recesses formed by features 115. These recesses allow for a full-width front of the 1 U assembly which spans the entire width between the "front" vertical members of rack 102. Dual rail systems 117 provide for extension of the 1 U outward from the rackmount system to allow a user to remove chassis covers 112A-B to service or replace the fan modules underneath. Dual rail systems 117 are mounted using fasteners, such as bolts, screws, or other fasteners to ones of the vertical elements of rack 102 to support the wright of assembly 100. The dual-rail nature allows for further extension outward than a single-rail, and internal ball-bearings allow for smooth movement in and out of rackmount assembly. Latches 114 can prevent inadvertent removal by coupling to front ones of the vertical members. Dual rail systems 117 each protrude into the space beyond storage assembly 100 and into vertical members of rack 102. A reduced width rear portion is employed to allow for features 115.

Figure 6:
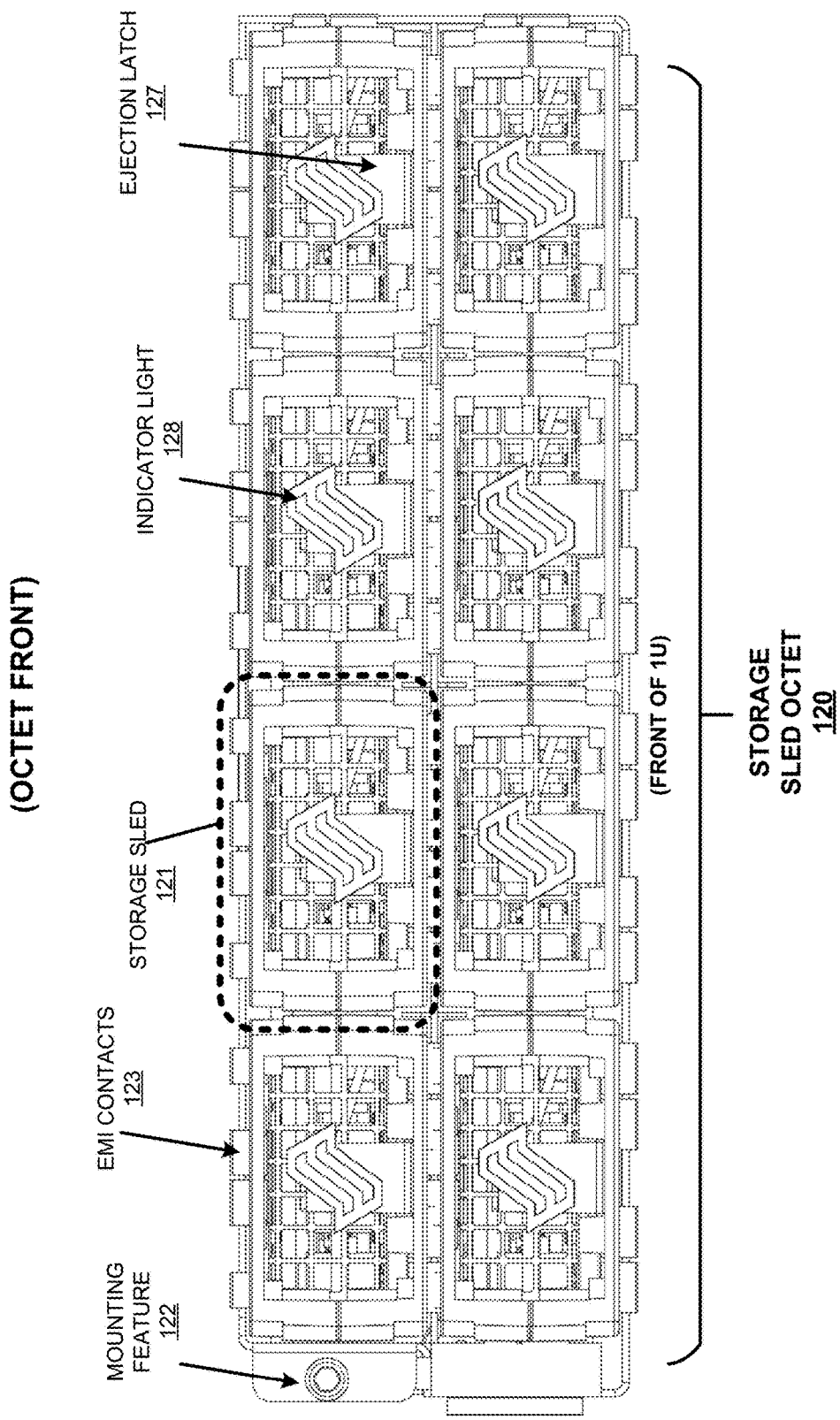
FIG. 6 is a diagram illustrating a storage octet assembly.

FIG. 6-10 illustrate various element of storage sled octet 120. In FIG. 6, a front view of storage sled octet 120 is shown. Eight storage sleds 121 are included in an octet, and each are insertable into individualized bays within a chassis of storage sled octet 120. Mounting feature 122 comprises a screw or other fastener for securing storage sled octet 120 into chassis 110 of storage assembly 100. In examples where mounting feature 122 comprises a screw, the turning of the screw provides insertion force to mate connectors of octet 120 into associated midplane connectors. Each sled 121 has an associated eject button 127 which allows for removal of an associated sled 121 from an octet assembly. Optional indicator light 128 can show status for an associated sled 121. For example, indicator light 128 can show storage activity of the associated storage drives. In other examples, indicator light 128 can indicate when removal is safe for a sled, such as when any in-transit data has been committed to non-volatile storage elements of the sled. Indicator light 128 can also show holdup power status for the sled, such as after a hot-removal of a sled or during power loss to system 100.

Electromagnetic interference (EMI) contacts 123 can be seen as protruding from each sled 121 and are configured to make contact with chassis 110 or with carrier 129 of the octet 120. In some examples, EMI contacts 123 electrically contact with conductive surfaces of carrier 129, while in other examples, EMI contacts 123 allow for electrical contact with conductive surfaces of the rackmount enclosure into which storage sled octet 120 is inserted. Combinations of configurations of EMI contacts 123 can be employed.

Figure 7:
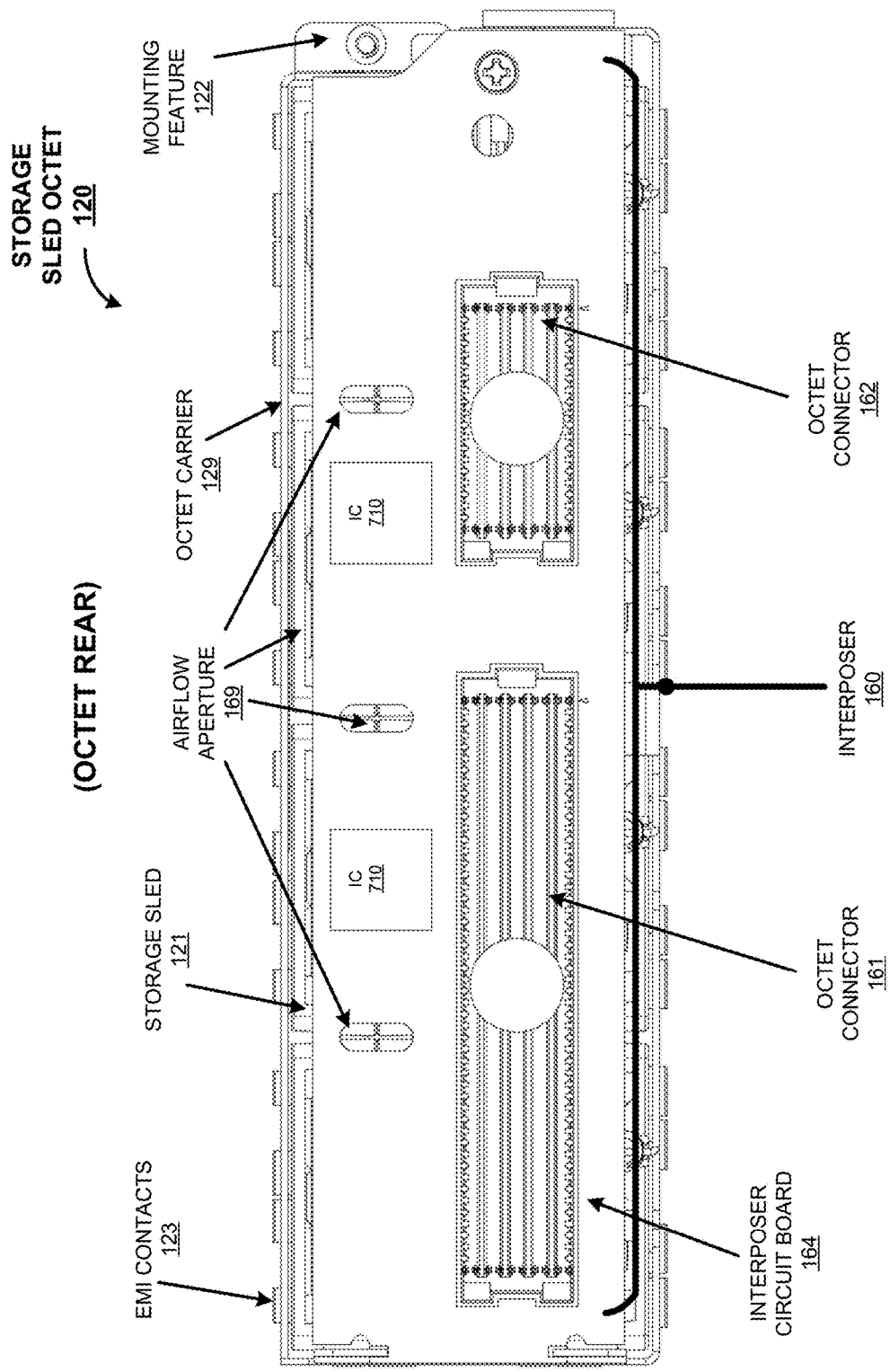
FIG. 7 is a diagram illustrating a storage octet assembly.

FIG. 7 shows a rear view of storage sled octet 120. In FIG. 7, octet connectors 161-162 are visible. Octet connectors 161-162 are included on a rear side of interposer 160. Octet connectors 161-162 are mounted on a rear side of interposer circuit board 164 to couple to associated connectors on a front side of midplane assembly 190, specifically front bay connectors 194-195 on midplane board 191. Octet connectors 161-162 are high-density, short wipe electrical connectors that carry PCIe communications as well as various sideband and power signals. Each storage sled 121 of an octet can plug into an individual associated mating sled connector 163 on a front side of interposer circuit board 164 of interposer 160. Various airflow apertures 169 are shown to allow for airflow through interposer 160 and the associated octet 120 using an associated fan module 170. Some of airflow apertures 169 are formed by gaps at the top and bottom of interposer circuit board 164. FIG. 7 also shows integrated circuits 710 which can couple to electrical signals of storage sleds for assisting communications with storage sleds, sideband signaling, and other features discussed in FIG. 25.

Figure 8:
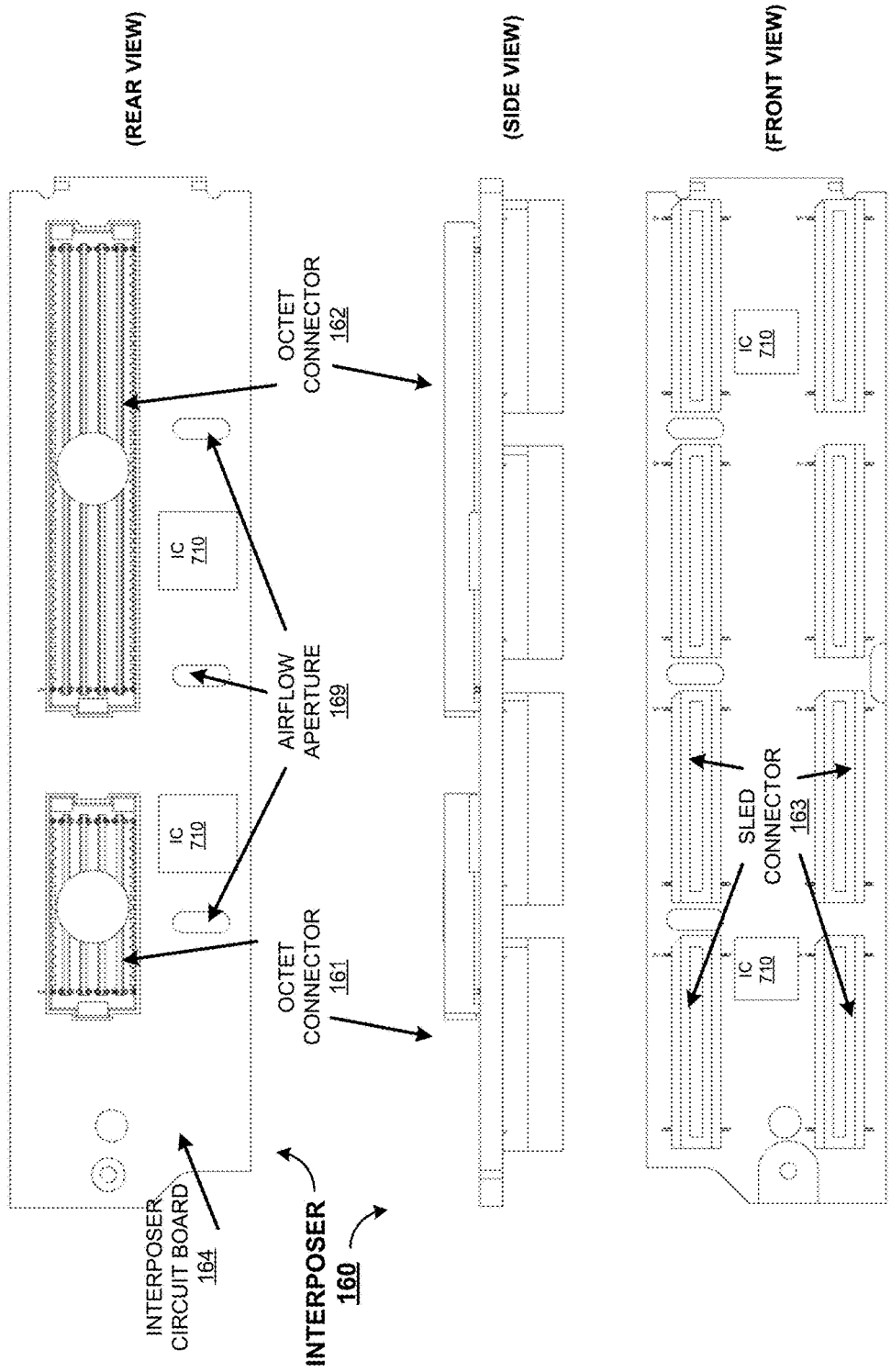
FIG. 8 is a diagram illustrating an interposer assembly.

FIG. 8 shows interposer 160 in three views, isolated from an octet assembly. Interposer 160 includes interposer circuit board 164 which mounts connectors 161-163. Connectors 161-162 both connect the entire octet 120 to midplane assembly 190, and sled connectors 163 each couple to individual sleds 121. In some examples, interposer circuit board 164 includes various circuitry to provide control and communication interconnection features to sleds 121 which are inserted into the octet.

Figure 9:
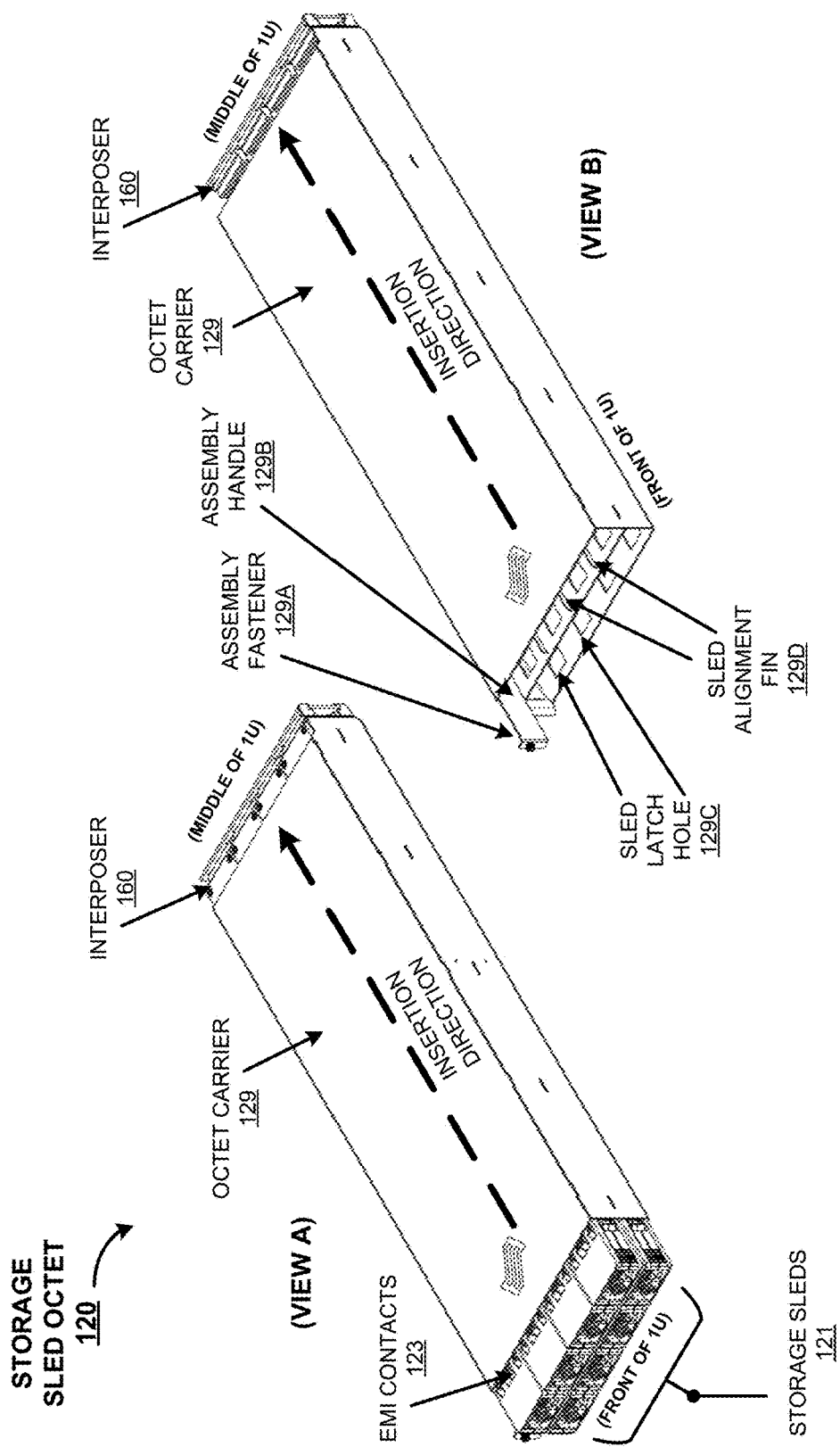
FIG. 9 is a diagram illustrating a storage octet assembly.

FIG. 9 illustrates storage sled octet 120 comprising octet carrier 129 into which storage sleds can be inserted into individually partitioned bays and structurally contained. FIG. 9 shows an eight-sled filled octet carrier 129 in "view A" and an empty octet carrier 129 in "view B." Storage sled octet 120 can hold up to eight storage sleds, such as storage sleds 121. The mechanical and structural elements of octet carrier 129 and associated mechanical and structural elements in FIG. 9 can comprise machined, forged, cast, extruded, or other manufactured elements. These elements can be made of metals, metallic compounds, polymers, plastics, ceramics, or other materials, including combinations and variations thereof.

Sled latch holes 129C can engage sled latches for the insertion and ejection processes discussed herein. Sled alignment fins 129D provide partitioned bays and channels for storage sleds to be inserted and inhibit side-to-side motion. Sled alignment fins 129D also ensure proper alignment of storage sleds during insertion to provide for proper mating of storage sled electrical connectors to connectors 163 associated with octet carrier 129. Storage sled octet 120 can be inserted into a bay of a further assembly or enclosure, such as a universal front-side bay 101 of a rackmount assembly or rackmount enclosure. Assembly handle 129B can provide for user insertion and removal of storage sled octet 120 in a bay of the rackmount enclosure, such as in a 1 U enclosure. Assembly fastener 129A secures storage sled octet 120 into the rackmount enclosure, and can include screws, snap features, latches, or other fasteners.

Interposer 160 is shown as coupled to octet carrier 129. Interposer 160 can be fastened using one or more screws, rivets, or latching mechanisms to hold interposer 160 in relation to octet carrier 129. Each storage sled 121 can plug into an associated mating connector 163 on interposer 160, and connectors 161-162 on an opposite side of a circuit board 164 of interposer 160 can mate with connectors 194-195 on a midplane assembly.

Figure 10:
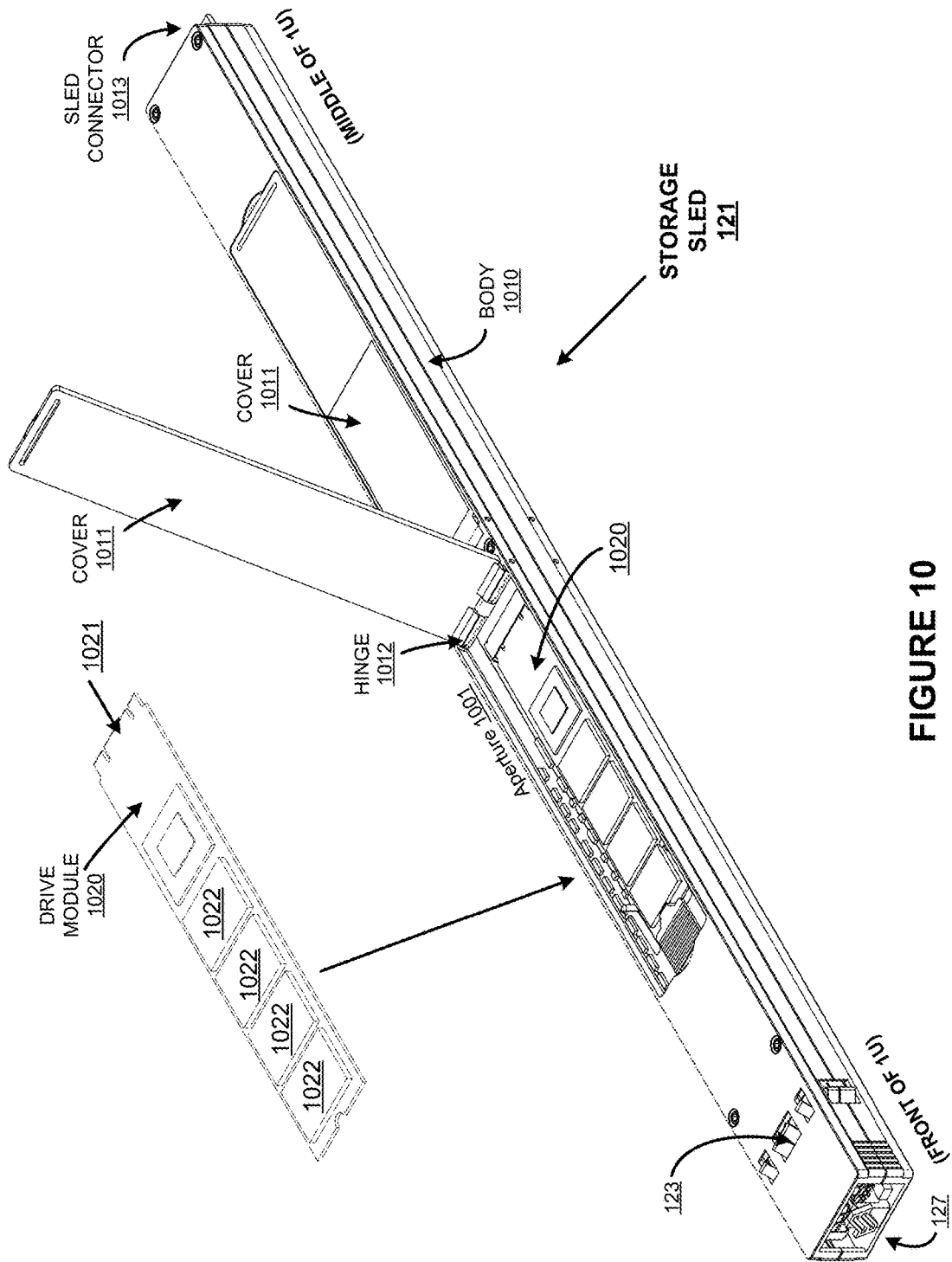
FIG. 10 is a diagram illustrating a storage sled assembly.

As an example of a data storage sled, FIG. 10 is presented. FIG. 10 is a diagram illustrating storage sled 121. Storage sled 121 includes various features and elements, and FIG. 10 illustrates at least storage sled body 1010, drive module covers 1011, cover hinges 1012, sled connector 1013, EMI contacts 123, and eject button 127. Additional features not labeled in FIG. 10 include body fasteners, cover closure features, lighted indicators, and side grip features. Although not shown in FIG. 10 for clarity and due to the selected view, storage sled 121 also includes two other covers and apertures for holding two additional drive modules 1020, for a total of four. The mechanical and structural elements of storage sled 121 and associated mechanical and structural elements in FIG. 10 can comprise machined, forged, cast, extruded, or other manufactured elements. These elements can be made of metals, metallic compounds, polymers, plastics, ceramics, or other materials, including combinations and variations thereof.

Storage sled 121 is configured to carry one or more drive modules, such as assembly drive module 1020 in FIG. 10, among other drive modules. In this example, up to four drive modules can be held by storage sled 121, with each drive module 1020 covered by an associated cover 1011 after being inserted into storage sled 121. Each of covers 1011 can be opened by a user or operator using associated cover closure features. Each of covers 1011 can be hinged at hinge 1012 which allow a user to rotate the associated cover outward from sled 121 to gain access to an aperture 1001 in which a drive module is inserted and removed. In some examples, hinge 1012 is spring-loaded and upon pressing a latch or friction-fit feature of a closure, hinge 1012 allows cover 1011 to open outward. When spring-loaded, hinge 1012 can provide resistance to closure by a user and a latch or mating features of a cover closure to keep cover 1011 closed and flush with body 1010.

Storage sled body 1010 is composed of at least two shell portions, namely a top body and a bottom body. The at least two body portions enclose a printed circuit board, sled insertion elements, and drive module mounting elements, and are secured together with fasteners, such as screws, rivets, clips, welds, and the like. Storage sled body 1010 is configured to be slid into associated mating features of a larger enclosure or storage assembly, such as an octet assembly, which can hold many storage sleds, as featured in FIG. 9 above.

Latch features are included on the bottom of sled 121 and are configured to engage with associated latch mates with an associated sled latch hole 129C of FIG. 9 within an octet assembly to provide purchase of storage sled 121 within the associated alignment fins 129D as well as provide resistance to removal of storage sled 121 from the associated mounting features in the assembly. Eject button 127 is coupled to the latch features to allow for ejection and removal of storage sled 121 from the octet assembly. Side grip features allow for a human operator to grip storage sled 121 for insertion and removal from an associated assembly. Once slid into associated mounting rails, guides, or features of the larger assembly, sled connector 1013 is configured to electrically and mechanically mate with an associated external connector, such as connector 163 on interposer printed circuit board (PCB) 164, or alternatively a midplane or backplane PCB of the assembly. Each sled connector 1013 carries PCIe communications as well as various sideband and power signals. Insertion of storage sled 121 in an incorrect orientation is prevented by a mating feature, such as a pin or protrusion, in the storage assembly, or alternatively by a unidirectional or keyed version of connector 1013.

Additionally, FIG. 10 shows EMI contacts 123. EMI contacts 123 are configured to electrically mate with storage sled body 1010. EMI contacts 123 can each be composed of metallic or conductive materials. When storage sled body 1010 is composed of non-conductive materials, then a metallic layer, such as a coating or foil, can line inner or outer surfaces of storage sled body 1010 to provide shielding, which electrically contacts EMI contacts 116. In some examples, EMI contacts 123 are formed from the same piece of conductive material, such as a stamped metal part that is folded and welded or soldered together to form EMI contacts 123. In other examples, EMI contacts 123 are formed from a machined metallic part or formed from separate pieces and electrically bonded together. EMI contacts 123 comprise one or more metallic fingers or springs which electrically contact both body 1010 and an associated assembly into which storage sled 121 is inserted or into a rack-mounted assembly into which the storage assembly is inserted. Thus, body 1010 forms a Faraday cage around electrical components of storage sled 121 and EMI contacts 123 are configured to touch external conductive surfaces and hold contact with the surfaces using a spring force formed by EMI contacts 123 extending outward from sled 121.

Drive module 1020 includes solid state memory chips 1022, and edge connector 1021. In some examples, the solid state storage elements of drive module 1020 include memory chips, such as chips 1022 which can comprise flash memory, magnetic random access memory, phase change memory, memristors, or other solid state memory devices. Drive module 1020 can comprise different form factors of drive modules. Drive module 1020 can include other components and elements, such as mounting holes, processors, interface chips, passive components, holdup circuitry, among other components and elements. In some examples, drive module 1020 comprises a M.2 solid state drive (SSD) module, which can have a variable dimensions, such as width and length, based on model, manufacturer, storage capacity, or embedded features, among other factors. Other examples include MiniPCI express cards, mini-serial ATA (mSATA) cards, and the like, with varying dimensions. Adjustable mount features allow for varying lengths of M.2 SSD modules, such as lengths of 16, 26, 30, 38, 42, 60, 80 and 110 millimeters (mm), among others. Advantageously, commodity or off-the-shelf M.2 SSD modules (or other drive modules) can be deployed in storage sled 121 using the adjustable mounting features.

Removal of drive module 1020 from storage sled 121 is as follows. Cover 1011, flush with body 1010 when closed, is opened using a fingernail or small item that engages a cover closure. Cover 1011 is opened by a user, or by a spring associated with hinge 1012 to expose drive module 1020 in aperture 1001. Drive module 1020 can then be removed from associated connector and from sled 121. Advantageously, sled 121 allows for tool-less insertion and removal.

To eject storage sled 121 from a storage assembly, eject button 127 is able to be pushed by an operator, and consequently move an eject lever which can engage a latch spring. Movement of eject button 127 is opposed by a spring force provided by the latch spring and associated fasteners to body 1010. The ejection process allows storage sled 121 to slide within an assembly into which sled 121 was previously inserted. An ejection spring, previously compressed by an insertion process, provides ejection force for sled 121 to move outward from a mating connector of the storage assembly and the storage assembly itself.

In further examples, a lighted ejection or insertion indicator 128 (as seen in FIG. 6) can be coupled to eject button 127. This indicator may be customized to appear as a logo or other shape or size. Various transparent or translucent features can allow light to be emitted from the indicator, such as glass, acrylic, or other polymer. In some examples, a light, such as a light emitting diode, can be included in the indicator which can indicate various properties of sled 121. These properties can include insertion or ejection status, such as lit when properly inserted and unlit when ejected. These properties can include other functional properties, such as an operational status of elements of sled 121. Light pipes, comprising a fiber optic element or polymer light guide, can be employed to carry light from an internal indicator circuit to the indicator. In examples where a light is mounted into the indicator, one or more wires or signal links can be employed and routed to eject button 127. An associated indicator circuit can be communicatively coupled to processing elements of sled 121.

Figure 11:
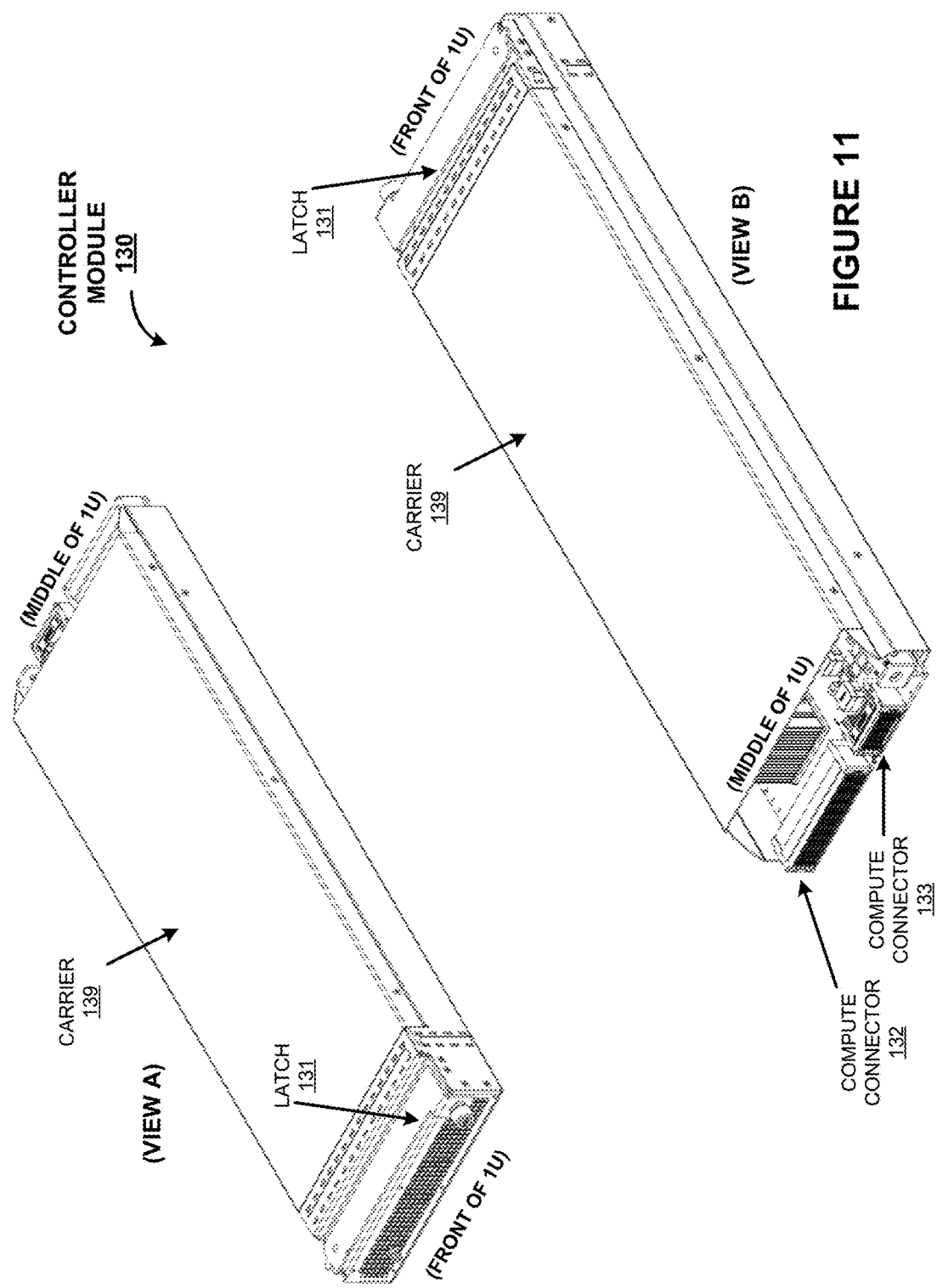
FIG. 11 is a diagram illustrating a controller module assembly.

FIG. 11 shows a detailed diagram of two views of controller module 130. View 'A' focuses on a front side of controller module 130, while view 'B' focuses on a rear side of controller module 130. Controller module 130 has connectors 132-133 for coupling to midplane assembly 190, specifically to front bay connectors 194-195. Connectors 132-133 can carry PCIe communications as well as various sideband and power signals. Controller module 130 also includes latch 131 for an operator to insert and remove controller module 130 from a storage assembly. Controller module 130 includes carrier 139 for carrying the various components of controller module 130. Controller module 130 also includes various casing and enclosure elements to cover the various electrical and mechanical elements of controller module 130.

Figure 12:
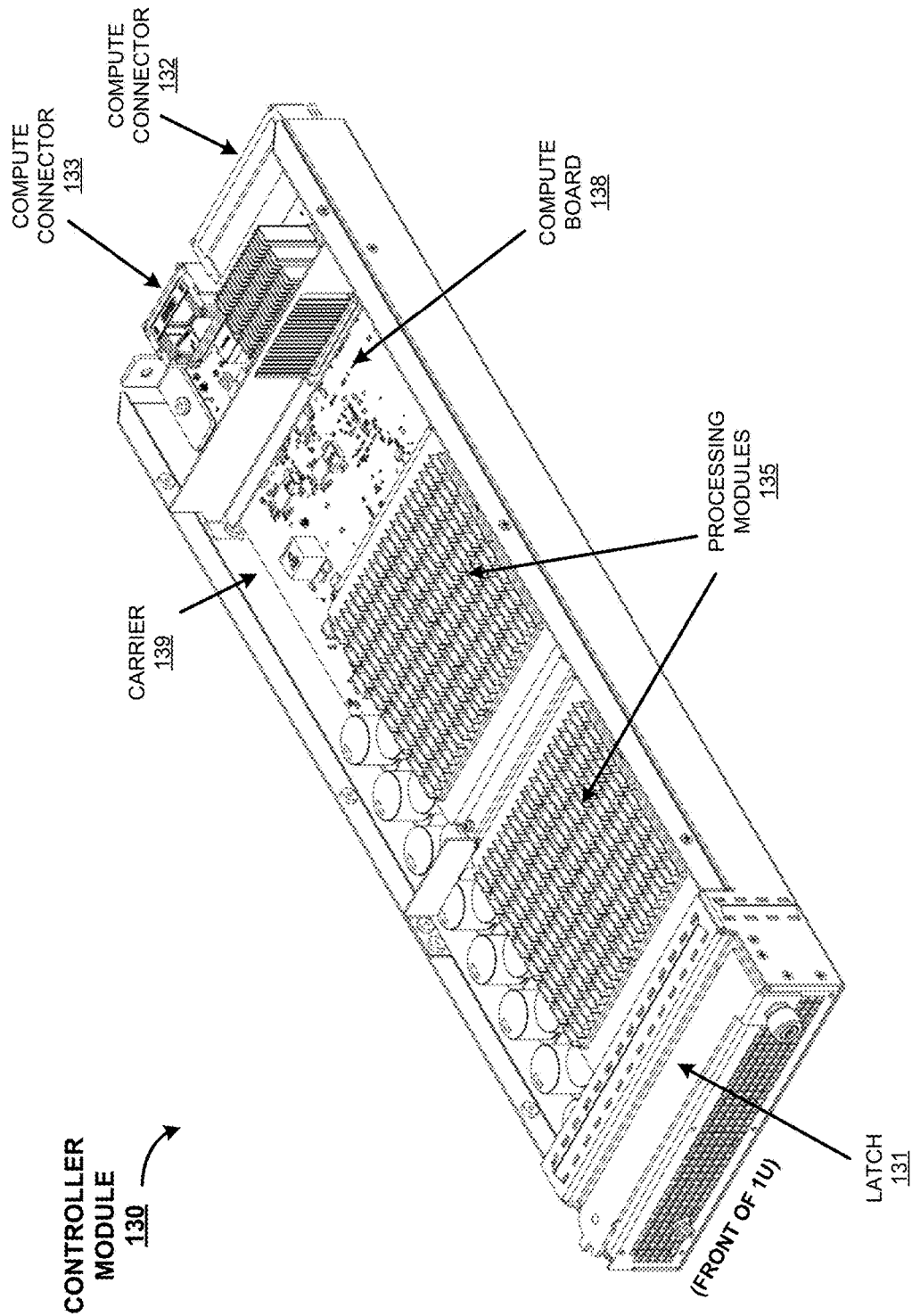
FIG. 12 is a diagram illustrating a controller module assembly.

FIG. 12 illustrates controller module 130 with an associated cover removed. As seen in FIG. 12, controller module 130 includes two processing modules 135 and compute board 138. Processing modules 135 are coupled to compute board 138. In some examples, compute board 138 comprises a plurality of connectors or sockets into which each of processing modules 135 are inserted. In other examples, each of processing modules 135 are soldered onto board 138. Additionally, connectors 132-133 are coupled to board 138, along with any associated circuitry, such as PCIe switches, sideband interfaces, filters, power components, and the like.

Processing modules 135 each include a processing system comprising central processing units (CPUs), which can comprise Intel, AMD, or ARM CPUs, among other varieties with any number of processing cores employed per CPU. The processing systems can comprise system-on-a-board or system-on-a-chip assemblies which comprise one or more CPUs, RAM (such as DRAM), and interfacing elements (such as PCIe interfaces, network interfaces, or other communication interfaces). These two processing systems can be seen in FIG. 12, although a different number of processing systems per controller module is possible.

Figure 13:
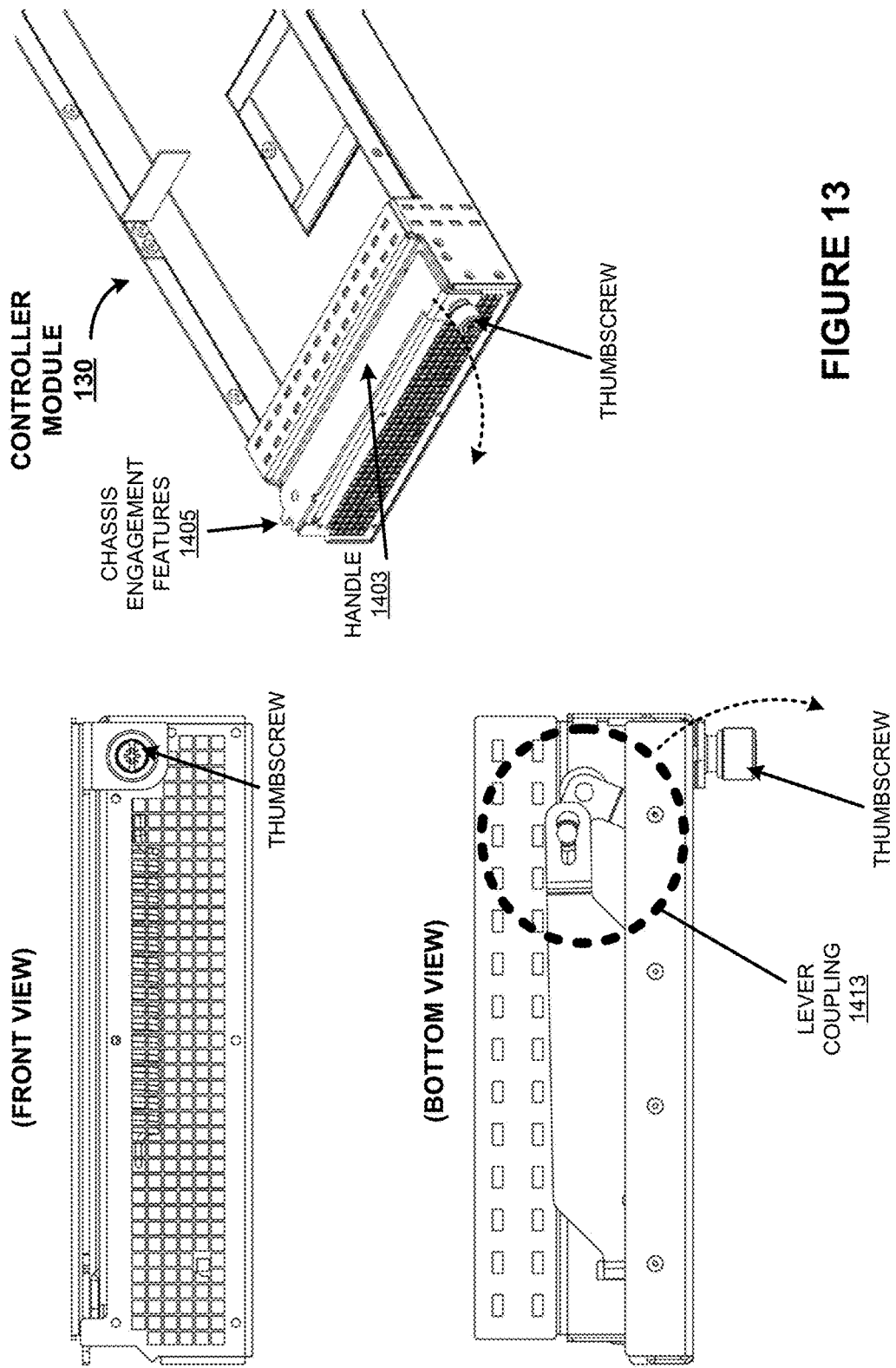
FIG. 13 is a diagram illustrating a controller module carrier.

FIG. 13 illustrates controller module 130 without compute board 138, connectors 132-133, and processing modules 135 to focus on carrier insertion and removal features. A front view and a bottom view are provided in FIG. 13. To insert controller module 130, a user slides controller module 130 into an empty front-side bay and engages chassis engagement features into an associated feature in the bay. Latch 131 is typically open and extended during insertion and a user puts force onto latch 131 to match module 130 into associated midplane connectors. A thumbscrew can be included to hold latch 131 in a closed position and ensure module 130 is not inadvertently removed. Continued screw force onto the thumbscrew end of latch 131 will cam the opposite end of latch 131 into the mating feature of the bay to allow for a precision fit of connectors 132-133 into mating midplane connectors 194-195. Lever coupling features 1413 are included to translate force exerted by a user on lever 131 to engage features 1405 into a mating slot of the bay.

Figure 14:
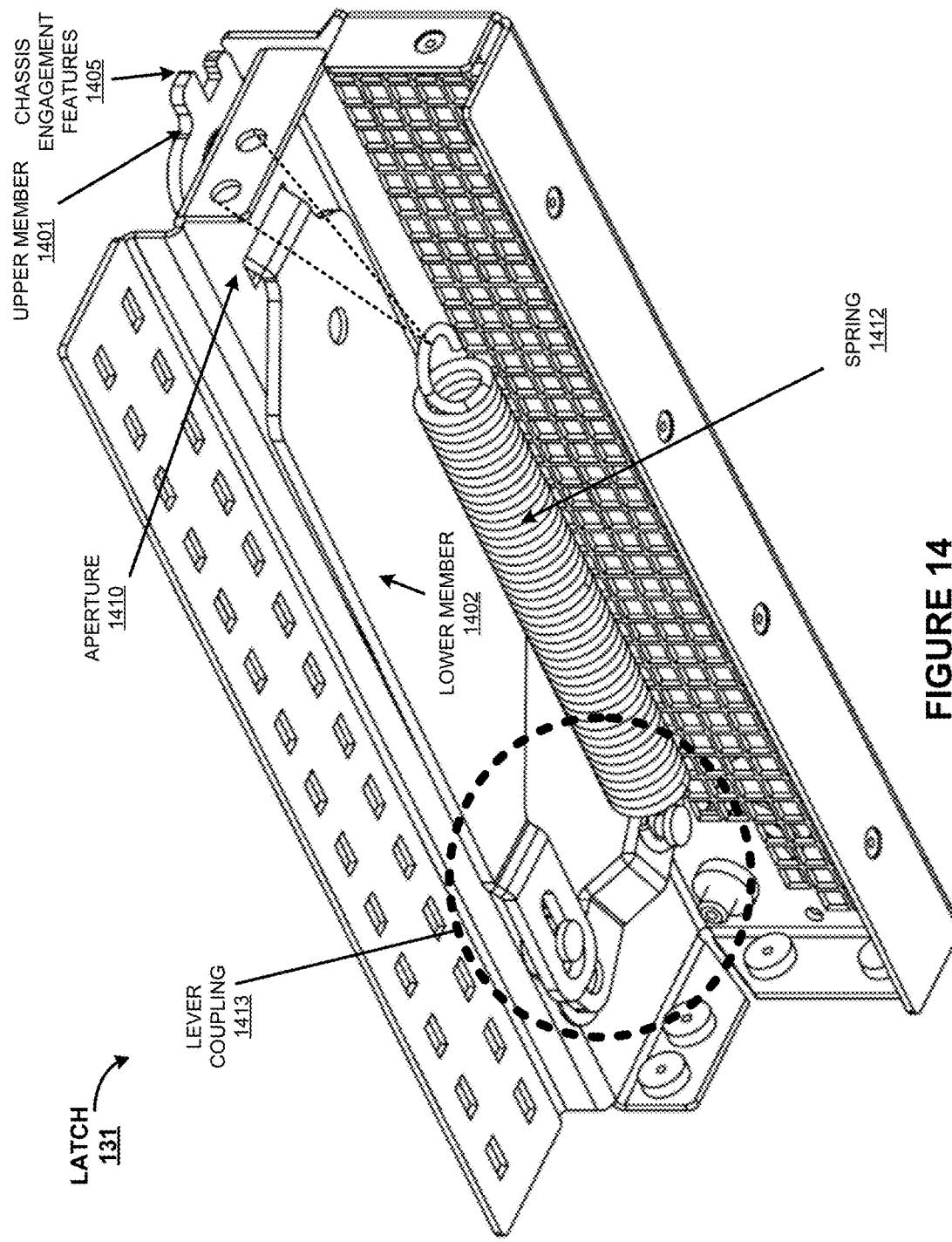
FIG. 14 is a diagram illustrating a latch assembly.

FIG. 14 illustrates latch 131 in more detail, from the underside facing outward. To allow for easy and quick insertion and removal of controller module 130 from an associated bay, various quick-disconnect features such as latch 131 and an associated thumbscrew are employed. However, the associated connectors, namely controller module connectors 132-133 and midplane connectors 194-195, are each high pin density, small wipe, connectors. Thus, a precision fit is achieved which does not over-stress the connectors or fail to properly seat the connectors into each other, and latch 131 allows for enhanced control of torque and force during insertion and removal of controller module 130.

In FIG. 14, latch 131 shows a two-layer design, with a stacked configuration comprising upper member 1401 and lower member 1402. Upper member 1401 and lower member 1402 can comprise metallic elements, such as sheet metal, or other suitable materials. Upper member 1401 and lower member 1402 are each fixed or coupled together aperture 1410. This attachment point can comprise welds, rivets, or other low-profile coupling fasteners. Several attachment points can be employed as pictured to ensure redundancy and rigidity in the connection between layers. Upper member 1401 and lower member 1402 are not rigidly joined or otherwise coupled at the end opposite attachment point aperture 1410, and instead are coupled using lever coupling 1413. In this example, lower member 1402 is configured to move in relation to upper member 1401 during insertion of the associated controller module into the at least one corresponding connector of midplane assembly 190.

Latch 131 comprises a coil spring 1412 and uses a design that allows the pivot of upper member 1401 to move and provide the compliance needed to engage at features 1405 into mating features of a bay. Latch 131 comprises a coil spring-bell crank operated-pivot compliant latch. One end of coil spring 1412 is coupled to lever coupling 1413 and another end of coil spring 1412 is coupled to carrier 139, such as the two holes shown in FIG. 14 in the carrier body. When latch 131 is fully engaged and controller module 130 fully inserted into associated midplane connectors, then a thumbscrew of latch 131 can be turned to further secure controller module 130 into the associated bay and prevent inadvertent movement of latch 131.

Chassis engagement features 1405 will engage an accompanying feature in a chassis or bay into which controller module 130 is inserted. When a user pushes on handle 1403, latch 131 will rotate about lever coupling 1413 and chassis engagement features 1405 will "cam" into the mating features of the bay/assembly and associated connectors on the rear of controller module 130 will begin to engage mating connectors on a midplane assembly. Interference aperture 1410 provides a physical window for lower member 1402 to move upper member 1401.

A force exerted on handle 1403 and consequently upon the associated connectors at the rear of controller module 130 can be controlled to a maximum amount using lever coupling 1413 and aperture 1410 as well as the material properties of spring 1412 and the layers of latch 131. Thus, a desired force for inserting controller module 130 into connectors of a midplane can be achieved. This advantageously allows for controlled force using a lever action while preventing too much bending and consequent over-pressure applied to rear connectors of controller module 130. In examples with high-density, small wipe connectors, latch 131 ensures repeatable and reliable mating. Removal of controller module 130 from the associated bay/assembly can occur in the reverse, where chassis engagement features 1405 can "cam out" of the associated mating features of the bay/assembly to decouple the associated rear connectors from the midplane.

FIG. 15 is a diagram illustrating storage assembly 100, with an isometric view of a "rear" side of storage assembly 100. An isometric "front" view of storage assembly 100 is shown in FIG. 1. Storage assembly 100 comprises a plurality of different modular elements which can be employed for input/output (I/O) of various digital data, interconnection with other storage assemblies of a cluster, and power supply to the various modules.

Storage assembly 100 includes at least one chassis element 110 which provides a structure for various modules to interconnect and for mounting into a rack or shelf system. Chassis element 110 also provides a structure for various enclosure elements, such as case elements 111-113. Each case element 111-113 in FIG. 15 forms an enclosure over the associated portion of assembly 100 and couples to fastening elements of chassis 110. Case element 111 covers the storage sleds and controller modules, case elements 112A-112B cover the midplane area and mid-mounted fans, and case element 113 covers the rear interconnect modules and power supplies. Rackmount latch 114 is employed to latch assembly 100 into associated mating features in a rackmount assembly/shelf or rack environment. Various handles can be employed on each module to insert and remove the associated module, and various handles can be employed on chassis 110 to insert and remove assembly 100 from an associated rack, such as shown for rackmount latches 114.

Recessed rackmount features 115 is included to couple to a rail system which is used to secure chassis 110 into a rackmount system or rack. A dual-rail system is included in FIGS. 4 and 5 which allows for a full-width front portion of the 1 U assembly while still providing for roll-out of assembly 100 from an associated rack to service mid-mounted fans.

In the rear side of storage assembly 100, bays are configured to hold various modules 140 and 180. Modules 14 and 180 couple electrically and mechanically to various connectors and associated mechanical features that comprise a midplane that is located generally in the center of storage assembly 100, and covered by case elements 112A-112B. Rear bays of storage assembly 100 can house interfaces modules 140 and power supplies 180. Each of the modular elements of storage assembly 100 couple electrically and mechanically to various connectors and associated mechanical features of the midplane.

Fabric module 140 comprises one or more communication interfaces via external connectors for communicatively coupling modules of storage assembly 100 to other storage assemblies, network links, user interfaces, or other elements. Fabric module 140 communicatively couples the selected external interfaces to the midplane of assembly 100. For example, fabric module 140 can comprise a PCIe fabric module that couples a PCIe fabric of storage assembly 100 to other storage systems or processing systems, such as other ones of storage assemblies 100. In PCIe examples, cluster interconnect 153 (seen in FIG. 3) can comprise mini-SAS HD jacks over which PCIe signaling is carried when associated mini-SAS HD cables are employed. Mini-SAS HD ports can be employed for cluster interconnect 153 that drive 12 Gb/s, which can support PCIe Gen 3 traffic.

Fabric module 140 also provides further external interfaces for storage assembly 100. As seen in FIGS. 3 and 15, these interfaces comprise Ethernet jacks for control plane network connections 152. The Ethernet jacks can support 10 Gigabit Ethernet (10 GbE), among other throughputs. Further external connectors 141 comprise Quad Small Form Factor Pluggable (QSFFP) or Quad (4-channel) Small Form-factor Pluggable (QSFP or QSFP+) jacks carrying at least 40 GbE signaling for interfacing with external host computing systems, the Internet, or other networked devices. In many examples, fabric module 140 allows for connection of storage assembly 100 to one or more networks for receipt and transfer of storage operations, such as with end users or other server/computing equipment. When Ethernet interfaces are employed, associated Ethernet jacks can support 40 Gigabit Ethernet (40 GbE), among other throughputs. Further external interfaces can include PCIe connections, Ethernet connections, FiberChannel connections, administrative console connections, sideband interfaces such as USB, RS-232, video interfaces such as video graphics array (VGA), high-density media interface (HDMI), digital video interface (DVI), among others, such as keyboard/mouse connections.

Power supply modules 180 each comprise power electronics, power conditioning equipment and circuitry, and various power conversion circuitry to convert line power introduced into a rear power port of each power supply into voltages/currents usable by storage assembly 100. Power supply modules 180 can be configured in a redundant arrangement, where failure of one or more of power supply modules 180 can be tolerated by use of one or more redundant power supply modules. In the midplane examples in FIGS. 17-18, specialized tiered features are included on midplane board 191 to couple high-current connectors for each power supply module to midplane board 191. The high-current connectors couple power supply modules to midplane board 191 with sufficient trace/conductor width to supply power to modules of the data storage assembly through midplane board 191. Control and status communication signals, as well as further power links, can also be employed between midplane 190 and power supplies 180, such as shown for power supply connector 193.

Figure 16:
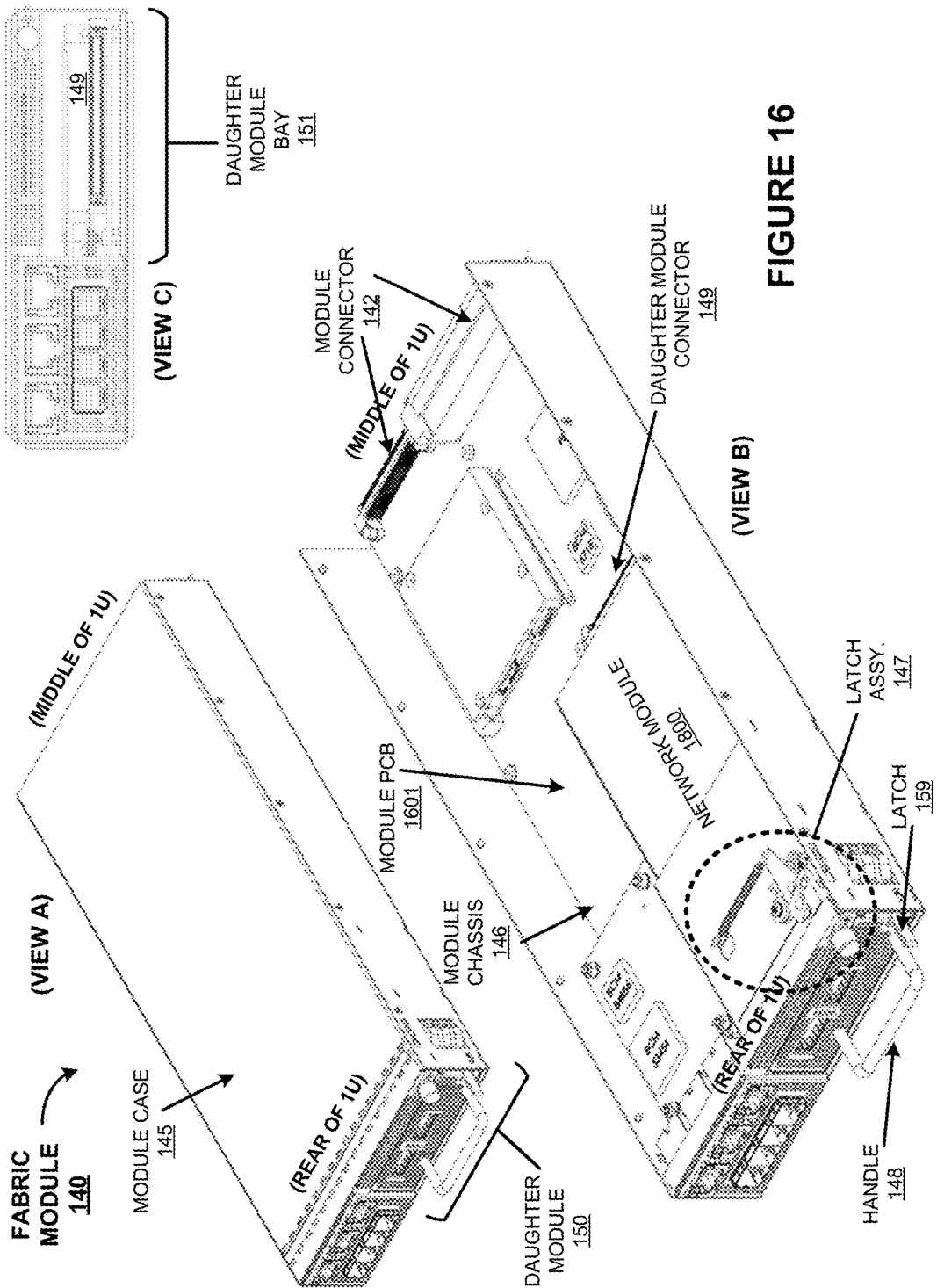
FIG. 16 is a diagram illustrating a fabric module assembly.

FIG. 16 shows detailed views of fabric module 140. View A in FIG. 16 illustrates a view of fabric module 140 with a module case 145 on, while view B in FIG. 16 illustrates a view of fabric module 140 with module case 145 removed. View C illustrates a front view of fabric module 140 with no daughter module inserted into bay 151. A front view with a daughter module inserted is shown in FIG. 3. Fabric module 140 can be inserted into ones of the rear-side bays of storage assembly 100. If more I/O resources or further redundancy is desired, then more fabric modules can be inserted into storage assembly 100. Empty bays are possible, and hot-plugging of the various fabric modules is also allowed. In this manner, storage assembly 100 can be customized on-the-fly to adapt to I/O or communication redundancy needs of a data center.

Fabric module 140 includes module case 145, module chassis 146, two module connectors 142, module printed circuit board (PCB) 1601, daughter module connector 149, and also includes bay 151 for mounting a daughter module, namely daughter module 150. In this example, network module 1800 comprises the daughter module, and in other examples different module types can be employed. Network module 1800 is shown in more detail in FIG. 18.

Fabric module 140 includes one or more circuit boards 1601 and external connectors which are communicatively coupled via PCIe interfaces over connectors 142 to rear bay connectors 197-198 of midplane assembly 190. Furthermore, fabric module 140 acts as a carrier or dock for daughter module 150 which also connects to midplane assembly 190 through connector 142 via a PCIe interface provided over daughter module connector 149. Thus, daughter module 150 is separately removable from fabric module 140 while fabric module 140 remains inserted into assembly 100. When daughter module 150 is removed, the functionality of fabric module 140 is not affected and I/O associated with fabric module 140 can continue. Daughter module 150 provides for more flexibility in interfaces, as daughter module can incorporate any number of external interfaces, such as Ethernet, iSCSI, PCIe, FiberChannel, Infiniband, USB, or other interfaces. Thus, while fabric module 140 can provide for consistent communications over associated external connections, daughter module 150 can be removed and swapped with different interfaces or swapped independently of fabric module 140 when failures occur to daughter module 150. In some cases, daughter module 150 is not employed, and an empty bay for a daughter module remains in fabric module 140, with any associated cover plates or ventilation covers. Daughter module 150 includes handle 148 for ease in removal and insertion into bay 151, and spring-loaded latch 159 for securing module 150 into bay 151. Latch 159 includes bay engagement features 158 (FIG. 18) which mates with slot 1701 (FIG. 17) of module 140.

Also visible in FIG. 3 is latch assembly 147, which is employed on each fabric module 140 to secure fabric module 140 into an associated rear-side bay of assembly 100. Latch assembly 147 is discussed in more detail in FIG. 17 below. Latch assembly 147 provides for a force to be applied during insertion of fabric module 140 into mating rear bay connectors 197-198 of midplane board 191. In the examples herein, two connectors 142 are employed on fabric module 140 which mate to corresponding rear bay connectors 197-198 on midplane board 191. Latch assembly 147 also provides for a precision insertion of the controller modules into the connectors of the midplane which employ tight tolerances and short or small wipe connectors to minimize signal losses and signal integrity problems from connector-to-connector coupling.

Figure 17:
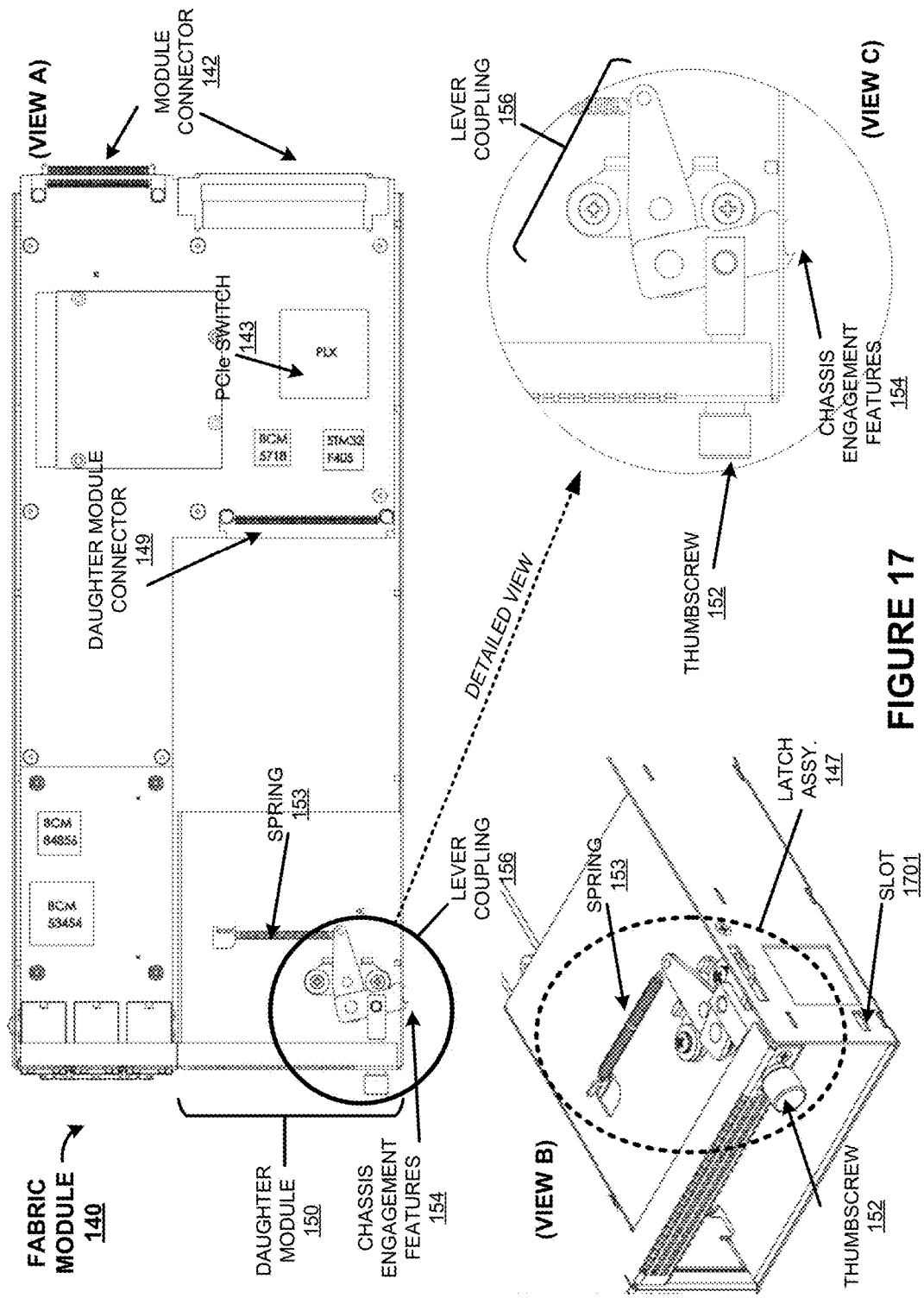
FIG. 17 is a diagram illustrating a fabric module assembly.

FIG. 17 shows detailed views of fabric module 140, focusing on latch features of fabric module 140. View A shows a top view of fabric module 140 which includes an inserted daughter module 150. View B shows a detailed isometric view of latch assembly 147. View C shows a detailed top view of latch assembly 147. Latch assembly 147 is employed on fabric module 140 to secure fabric module 140 into an associated rear-side bay of assembly 100.

To insert fabric module 140 into a bay, a user slides fabric module 140 into an empty rear-side bay and screws thumbscrew 152 to engage chassis engagement features 154 into an associated feature in the bay. Latch assembly 147 uses a basis thumb screw to mate and de-mate fabric module 140, with a spring loaded design that includes spring 153 as well as level coupling features 156. The spring loaded design lets the thumbscrew-activated latch engage a single sheet of metal on the side wall of an associate bay. The spring provides an outward bias to the latch mechanism. Continued screw force onto the thumbscrew of latch assembly 147 will cam features 154 of latch assembly 147 into the mating feature of the bay to allow for a precision fit of connectors 142 into mating midplane rear bay connectors 197-198. Lever coupling features 156 are included to translate force exerted by a user on thumbscrew 152 of latch assembly 147 to engage features 154 into a mating slot of the bay. Module connectors 142 and midplane rear bay connectors 197-198, are each high pin density, small wipe, connectors. Thus, a precision fit is achieved which does not over-stress the connectors or fail to properly seat the connectors into each other, and latch assembly 147 allows for enhanced control of torque and force during insertion and removal of fabric module 140. FIG. 17 illustrates latch assembly 147 in more detail in views B and C.

Figure 18:
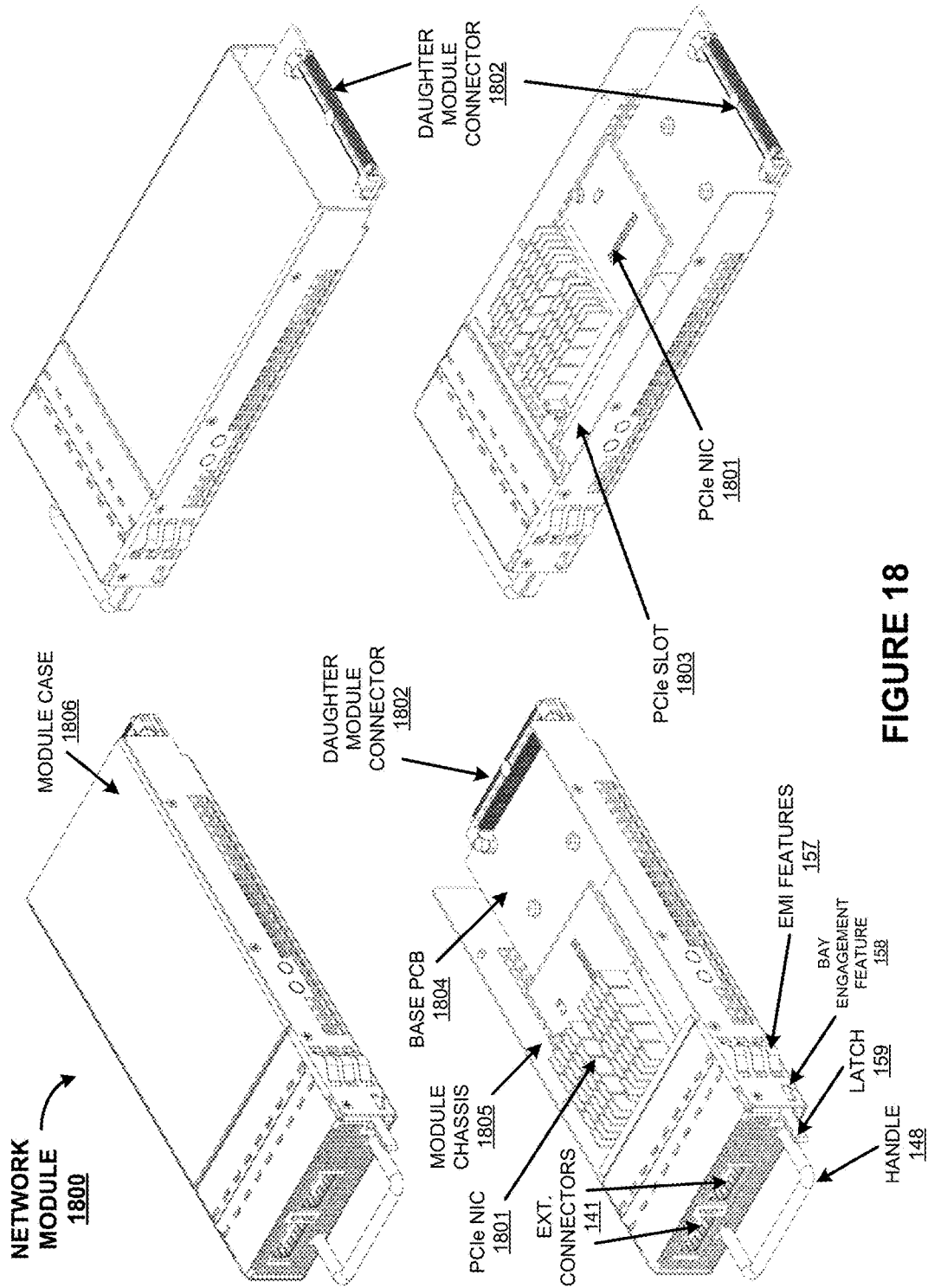
FIG. 18 is a diagram illustrating a network module assembly.

FIG. 18 shows detailed views of network module 1800, as one example of a daughter module 150 insertable into bay 151 of fabric module 140. Other modules are possible with different functionality than network module 1800. Network module 1800 comprises module case 1806 and module chassis 1805 which house one or more PCBs. In FIG. 18, base PCB 1804 carries PCIe network interface card (NIC) 1801. Daughter module connector 1802 couples to connector 149 of fabric module 140, and when connector 149 is mated into fabric module 140, connects to the midplane. Network module 1800 couples over a PCIe interface provided by PCIe slot 1803, base PCB 1804, and connector 1802. Network module 1800 provides external connectors 141 which can comprise Quad Small Form Factor Pluggable (QSFFP) or QSFP/QSFP+ jacks carrying at least 40 GbE signaling for interfacing with external host computing systems, the Internet, or other networked devices. In many examples, network module 1800 allows for connection of storage assembly 100 to one or more networks for receipt and transfer of storage operations, such as with end users or other server/computing equipment. When Ethernet interfaces are employed, associated Ethernet jacks can support 40 Gigabit Ethernet (40 GbE), among other throughputs.

In this example, PCIe NIC 1801 comprises a PCIe peripheral card which is inserted into a right-angle PCIe slot 1803 on base PCB 1804. The PCIe card can comprise a HHHL card in some examples, although other heights and lengths of PCIe cards can be employed. The PCIe card can comprise any PCIe card which fits into the form factor of fabric module 140, and thus a highly flexible communication interface can be achieved. Moreover, each of the two possible interfaces modules 140 employed in assembly 100 can employ different communication interfaces or PCIe cards, allowing for a plurality of communication interfaces to be communicatively coupled to midplane 190 using a common or similar fabric module 140. Further external interfaces can include external PCIe connections, Ethernet connections, FiberChannel connections, administrative console connections, sideband interfaces such as USB, RS-232, video interfaces such as video graphics array (VGA), high-density media interface (HDMI), digital video interface (DVI), among others, such as keyboard/mouse connections.

Figure 19:
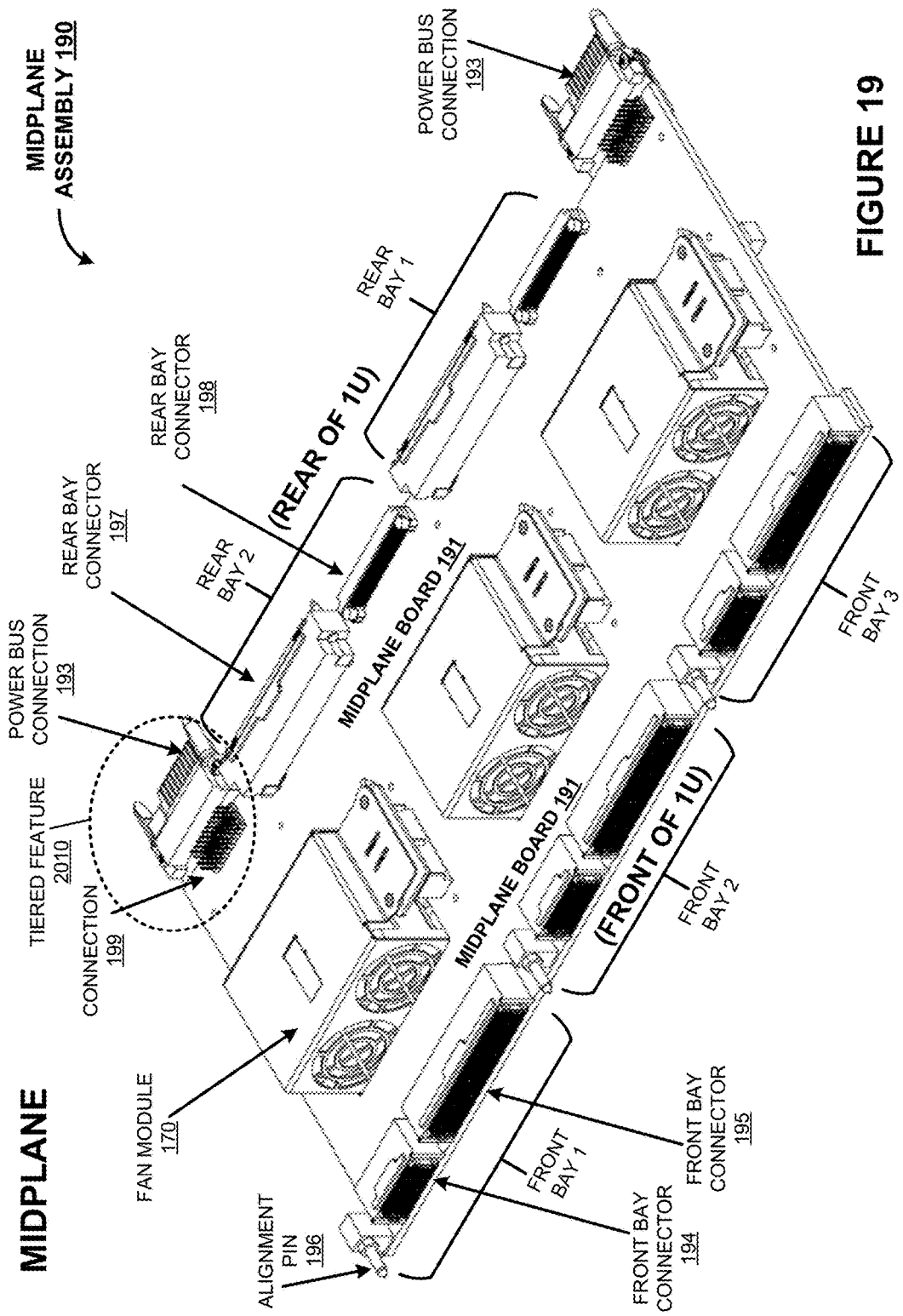
FIG. 19 is a diagram illustrating a midplane assembly.
Figure 20:
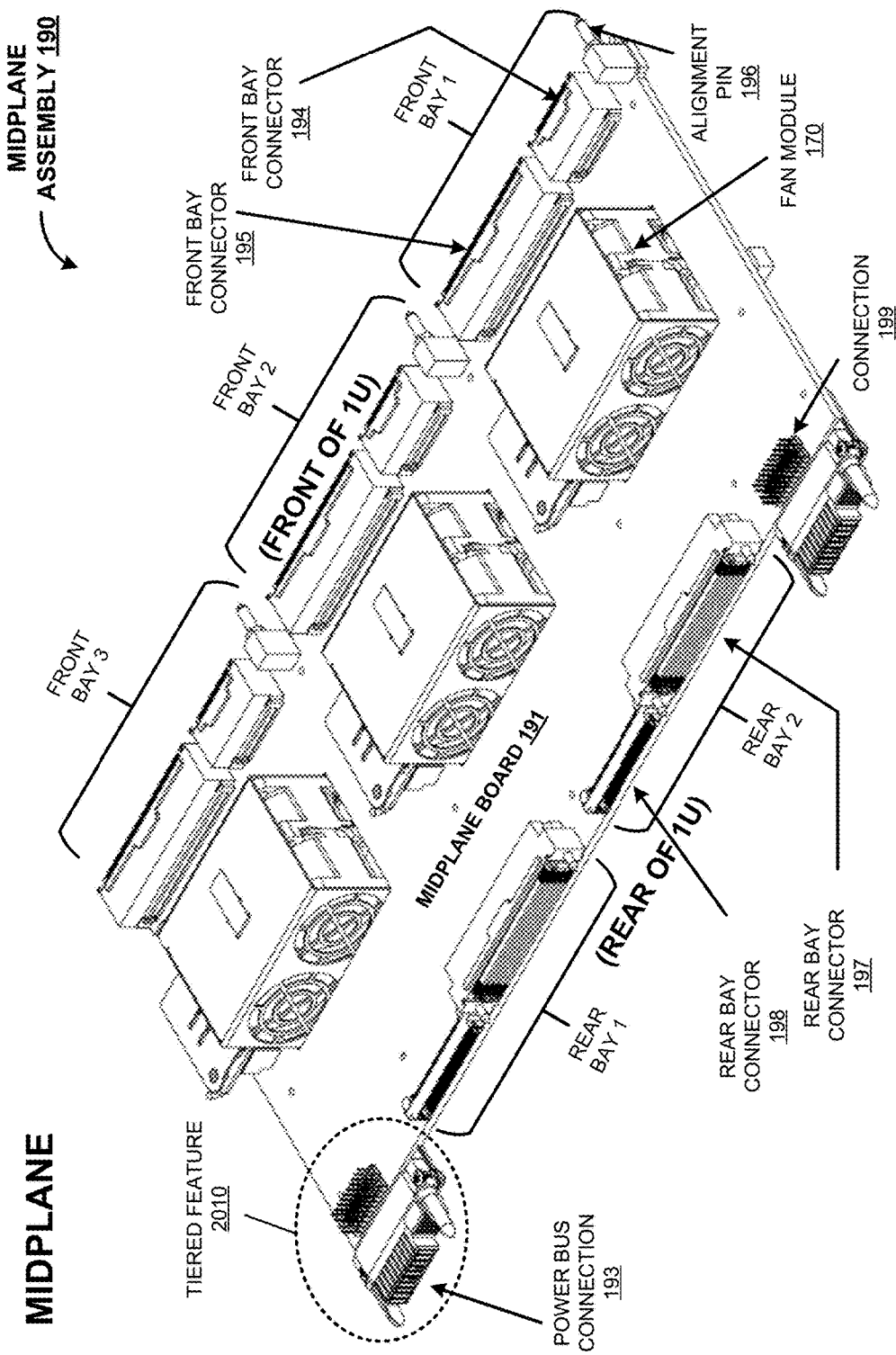
FIG. 20 is a diagram illustrating a midplane assembly.
Figure 21:
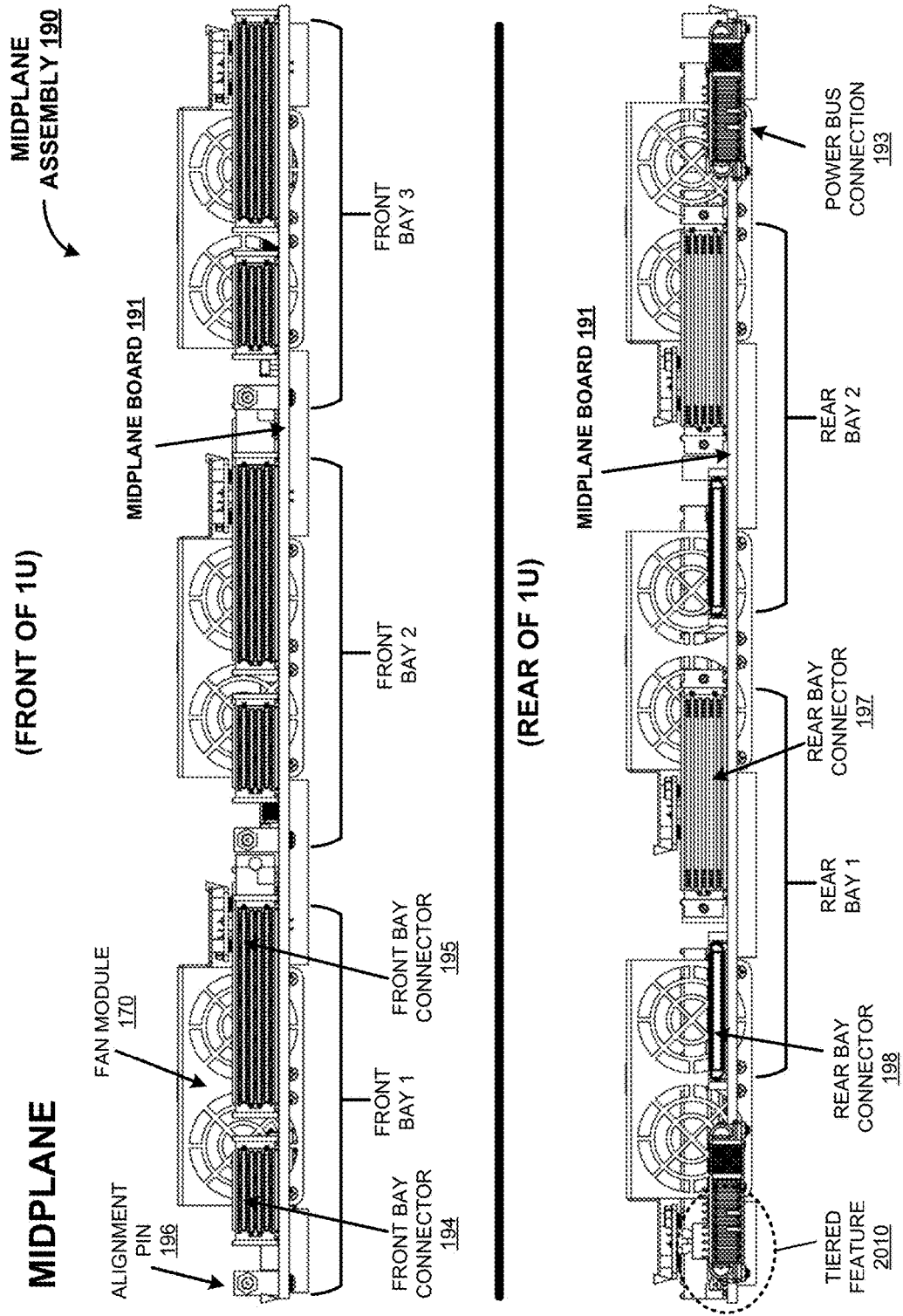
FIG. 21 is a diagram illustrating views of a midplane assembly.

Turning now to midplane assembly 190, FIG. 19-21 are presented. FIG. 19 presents midplane assembly 190 with a "front" side isometric view. FIG. 20 presents midplane assembly 190 with a "rear" side isometric view. FIG. 21 presents midplane assembly 190 with both "front" and "rear" views. Midplane assembly 190 provides for both front and rear bays in storage assembly 100, which advantageously allows for high-density arrangements of storage sleds, controller modules, fabric modules, interface modules, power supplies, fan modules, and other components. Midplane assembly 190 also provides cutouts for mid-mounted fans in storage assembly 100, leading to more efficient cooling of storage assembly 100 and less restricted airflow throughout.

Midplane assembly 190 comprises one main circuitry board with two further adjunct circuit boards in this example, namely midplane board 191 and two power tails. The power tail features are included in tiered feature 2010 and shown in more detail in FIGS. 20-23. Midplane board 191 is coupled to chassis 110 of storage assembly 100 by one or more screws, rivets, or other fasteners. Midplane assembly 190 includes a volume of space created by cavities cut out of midplane board 191 into which one or more fan modules 170 are inserted. Fan modules 170 provide for airflow in storage assembly 100 to cool the various front and rear modules therein. FIG. 19 illustrates three fan modules installed in the volume provided by the cavities cut out of midplane board 191. Various airflow features can be provided in to allow for airflow through midplane assembly 190 and into modules in the front and rear of storage assembly 100.

Midplane board 191 comprises a front side and a rear side. The front side of midplane board 191 comprises one or more connectors and alignment features for coupling to front side modules, such as storage sled octets 120 and controller modules 130. Pairs of front-side connectors 194-195 are employed for each bay/module as well as an associated alignment pin 196. This front-side module connector configuration allows for high-density, short wipe connectors to be in a compact and efficient form factor. FIG. 20 illustrates the back side of midplane board 191, which includes interfaces over rear bay connectors 197-198 which couple to associated connectors on fabric module 140. Midplane board 191 also includes one or more power bus connections 193 for connecting high-current power links to associated power supply modules 180. Midplane board 191 can also comprise various circuit links, traces, and other interconnect which communicatively couple ones of the front bay connectors 194-195 with rear bay connectors 197-198 on the back side of midplane board 191. In further examples, midplane board 191 can include one or more holdup components for use during power-loss events of storage assembly 100, such as capacitor arrays.

Fan modules 170 also include airflow directional elements, among other features. These airflow directional elements ensure airflow associated with the fan module 170 is directed to flow over and through the various front and rear modules in storage assembly 100. Each of the front and rear modules in storage assembly 100 includes external panels which allow for airflow, such as screens, mesh, EMI cages, perforations, and the like. In some examples, each fan module 170 comprises at least two fans. Fan modules 170 can comprise any fan type, such as axial-flow, centrifugal and cross-flow, or other fan types, including associated ducts, louvers, fins, or other directional elements, including combinations and variations thereof.

Figure 22:
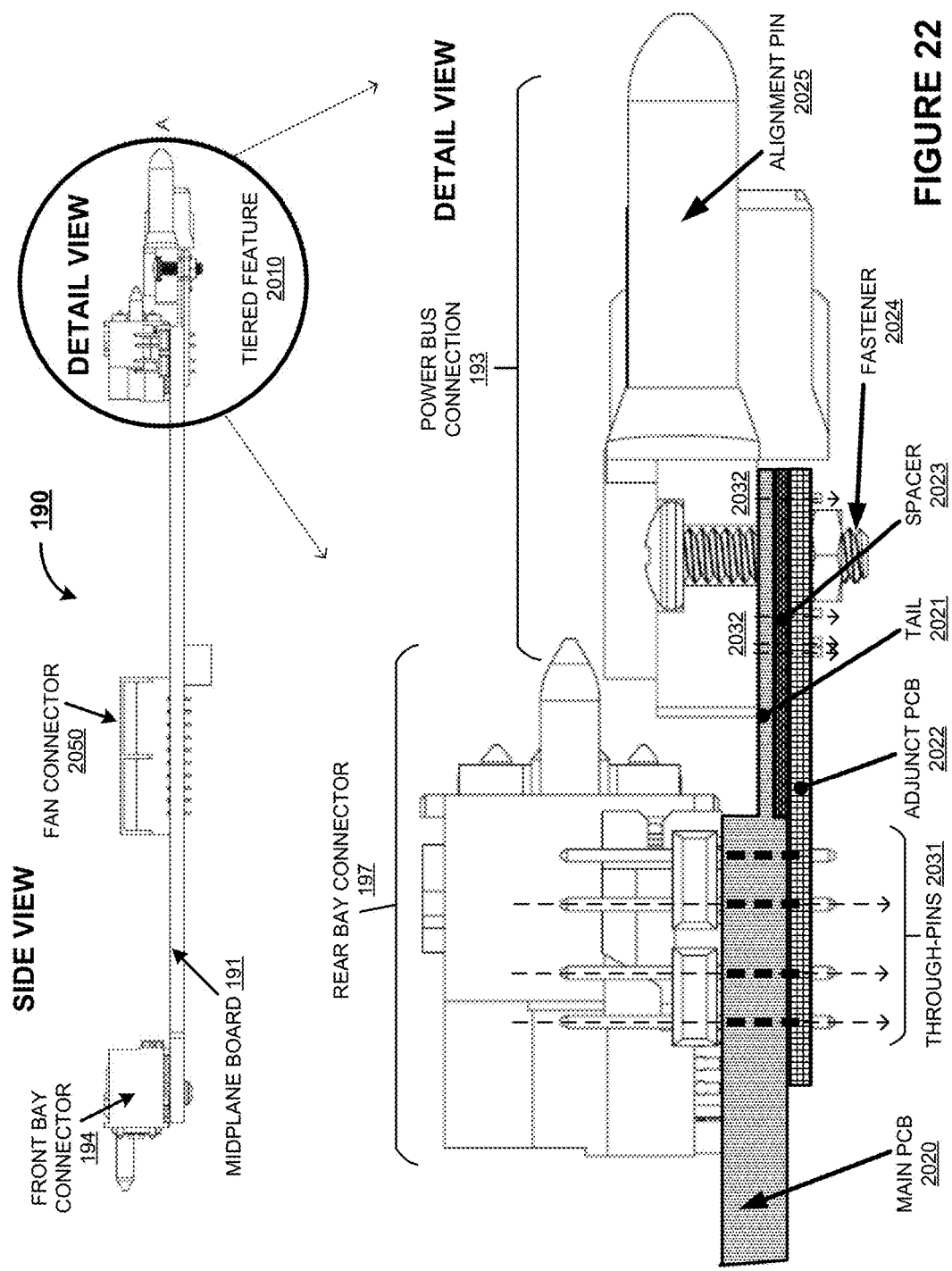
FIG. 22 is a diagram illustrating views of a midplane assembly.
Figure 23:
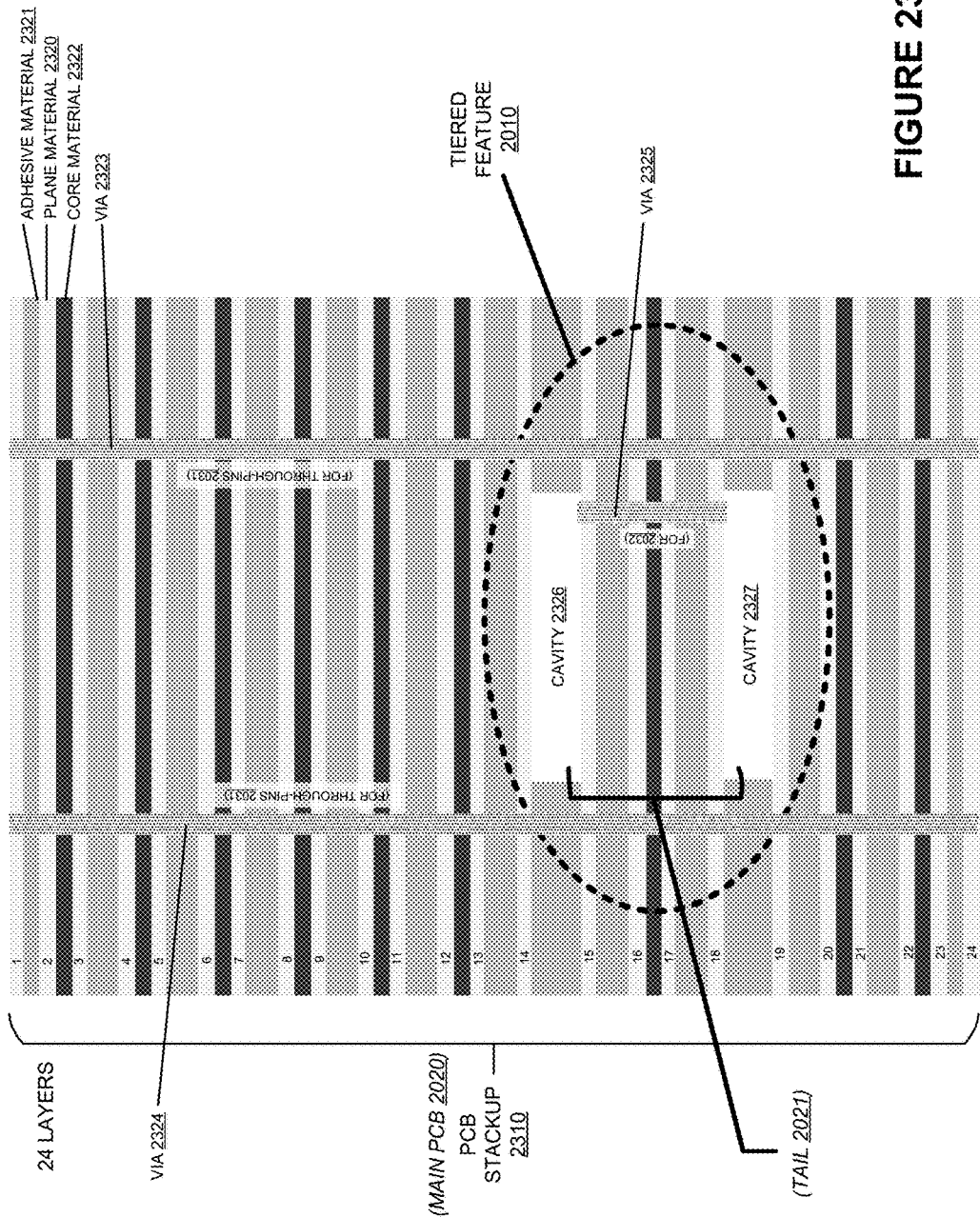
FIG. 23 is a diagram illustrating stackup of a midplane board.

FIG. 22-23 illustrates detailed views of tiered feature 2010 on midplane assembly 190. FIG. 22 includes a side view of midplane assembly 190 and a further detailed view of tiered feature 2010. The side view of midplane assembly 190 in FIG. 22 shows any associated fan modules removed, and includes fan connector 2050 to which a fan module couples for power, control, and monitoring signals. Front bay connector 194 is also seen in the side view.

The detailed view of tiered feature 2010 illustrates several connectors. Rear bay connector 197 is shown as well as power bus connection 193. One or more fasteners 2024 are included to secure power bus connection 193 to tiered feature 2010. Furthermore, 2×10 through-pins headers 2031 are included which protrude through the entire stackup of tiered feature 2010 to connect conductive layers of tiered feature 2010 and provide for high-current coupling between circuit traces of tail 2021/adjunct PCB 2022 and main PCB 2020.

Tiered feature 2010 is formed main PCB 2020, adjunct PCB 2022, and spacer 2023. Main PCB 2020 includes tail feature 2021. Tail feature 2021 is rigid and formed from the same material as main PCB 2020 but milled down to create tail feature 2021. Tail feature 2021 is provided to ensure a desired stackup height for power bus connection 193 onto main PCB 2020 without using a flex circuit or rigid-flex configuration. Advantageously, tiered feature 2010 mechanically and communicatively couples circuit boards together at different "stackups" to properly provide alignment of connectors 193 with connectors of power supply modules. Manufacturing costs and effort are significantly lower than for other configurations such as a single midplane board that requires cabled/wired cumbersome connections for power supply modules. Manufacturing costs are significantly lower than a flexible or "flex" circuit board arrangement as well as rigid-flex arrangements.

Adjunct PCB 2022 is provided to allow for further conductive material to carry high current supply power to main PCB 2020 from power bus connection 193. Both tail 2021 and adjunct PCB 2022 carry signaling and current from connection 193 to main PCB 2020. Spacer 2023 provides for correct vertical alignment between tail 2021 and adjunct PCB 2022. As can be seen in FIG. 22, connection 193 includes through-pins 2032 which protrude through both tail 2021 and adjunct PCB 2022, and each of tail 2021 and adjunct PCB 2022 carries current associated with connection 193. Through-pins 2031 electrically connect associated traces of adjunct PCB 2022 and of main PCB 2020 to provide the high current from the associated power supplies onto main PCB 2020, while allowing for the particular vertical mating dimensions of the power supply modules with tail 201. Two tails 2021 and two associated power bus connections 193 are included on main PCB 2020, as seen in FIGS. 19-21.

Figure 24:
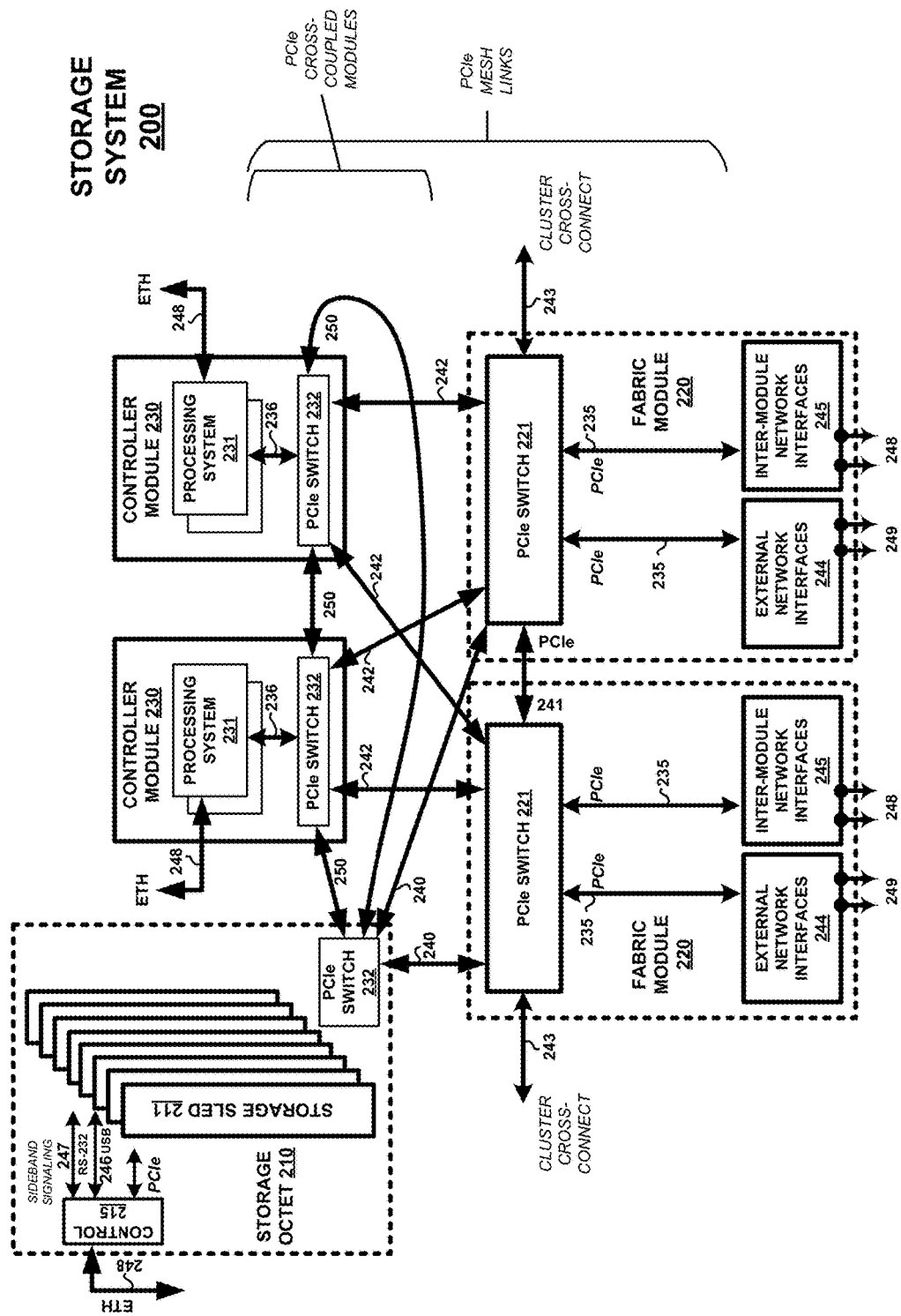
FIG. 24 is a system diagram illustrating a storage system.

To achieve tiered features 2010 and tail 2021, a particular PCB stackup is employed. This stackup is shown in FIG. 24 as PCB stackup 2310. Stackup 2310 provides a side view of main PCB 2020, from a PCB manufacturing standpoint. Several planes of material are stacked and laminated to form a circuit board, specifically 24 conductive layers with circuit traces in this example. The yellow/copper colored layers comprise routing layers used for providing conductive traces, noted by plane material 2320. The dark green colored layers provide for core material which can comprise resin, epoxy, fiberglass, prepreg, or other materials used for electrical isolation of layers and structural rigidity. The light green colored layers provide for adhesion during lamination of the layers, and is noted by adhesive material 2321 which can comprise resin, epoxy, or other adhesive. Further layers can be included, such as solder masks, screen printing, conformal coating, or other surface features and layers. It should be understood that a different number of layers can be employed.

Various vias are included in the stackup, but in FIG. 24 a subset of vias is shown, namely vias 2323-2325. Vias 2323-2324 are provided for through-pins 2031 to connect through. Via 2325 is provided on tail 2021 and used for through pins associated with connection 193, namely through-pins 2032.

Cavities 2326-2327 represent the portion of main PCB 2020 which is milled away to create tail 2021. Cavities 2326-2327 are embedded in the stackup to aid in creation of tail 2021. To make main PCB 2020 with tail 2021, a full-shaped PCB is formed, and a milling process is performed to mill out a vertical portions of the full PCB to create tail 2021. This milling process is aided by cavities 2326-2327. Specifically, the milling process mills out layers 1-14 and 19-24 in the associated tail areas, with milling performed on both a top side and bottom side of the full PCB. Once milling is complete, then tiered feature 2010 is formed on main PCB 2020 in a portion of layers 15 thru 18. Cavities 2326-2327 (those areas above layer 15 and below layer 18) comprise thick soft material that can mill out in just the cavity area. That soft area is the material can comprise adhesive 1080 67BE N and can equate to 7.5 mils between Layers 14 and 15 and also Layers 18 and 19, throughout the entire PCB shape. Thus, tail 2021 is formed at 70 mil below Layer 1 (Top Layer). This can accommodate for the (70 mil) drop in mating levels between connectors used for the modules of assembly 100 the connectors for the power supply modules.

FIG. 24 is a system diagram illustrating storage system 200. Storage system 200 comprises an example electrical schematic view of the various modules of the previous figures. Storage system 200 includes several different module types in FIG. 24, namely storage sleds 211, fabric modules 220, and controller modules 230. In this example, at least one storage octet, at least two fabric modules, and at least one controller module are included. However, it should be understood that a different number of storage octets 210, fabric modules 220, and controller modules 230 can be included. Additionally, power supply modules, fans, and associated power and control distribution links can also be included, but are omitted in FIG. 24 for clarity. Interposer equipment of storage sled octets are omitted in FIG. 24 for clarity to emphasize communication relationships.

As discussed in the examples above, a module or sled typically comprises physical support structure and enclosure that includes circuitry, printed circuit boards, semiconductor systems, and structural elements. The modules are insertable and removable from a rackmount style of enclosure. In some examples, the elements of FIG. 24 are included in a 1 U chassis for mounting in a larger rackmount environment. It should be understood that the elements of FIG. 24 can be included in any physical mounting environment, and need not include any associated enclosures or rackmount elements.

A plurality of storage sleds 211 are included in one or more storage octets 210 in system 200. Each storage sled 211 includes one or more storage drives, such as four in some examples. Each storage sled 211 also includes Peripheral Component Interconnect Express (PCIe) switches, processors, and control system elements. PCIe switches of each storage sled 211 communicate with one or more on-sled storage drives over associated PCIe links. PCIe switches of each storage sled 211 also are communicatively coupled to an on-sled processor or control system (215) for traffic statistics retrieval and status monitoring, among other operations. PCIe switches 232 of each storage octet 210 communicate over one or more PCIe links 240 with an associated PCIe switch of a fabric module 220 or controller module 230.

PCIe switches 232 and 221 form a PCIe fabric which is used for the transfer of storage operations and control instructions between storage sleds, controller modules, and communication interfaces. Each PCIe switch is cross-connected with one or more PCIe switch over PCIe fabric links as shown. Each PCIe switch 221 of fabric modules 220 communicate over associated PCIe links 242 with associated PCIe switch 232 of one or more controller modules 230 or octets 210. PCIe switch 232 communicates with one or more associated processing systems 231 over PCIe links 236. Fabric modules 220 also each use PCIe switches 221 for interconnecting processor modules, such as processor modules 230. PCIe switches 221 are employed for this processor module cross-connect, and communicate with ones of PCIe switches 221 in associated controller modules 230 over processor module cross-connect links 242. PCIe switch 232 communicates with ones of processing systems 231 over PCIe links 236. PCIe switches 221 can also each include 1 U cross-connect links 243, which are used to expand the PCIe fabric to other physical 1 U enclosures.

In the example in FIG. 24, PCIe switches 221 and 232 (and associated PCIe links) include a mesh data plane of system 200 used for carrying user data between storage sleds 211, controller modules 230, and communication interfaces. PCIe switches 221 and 232 (and associated PCIe links) also carry user data and signaling between controller modules and externally-facing network interfaces. Links 240, 242, and 250 can be included in a midplane assembly with associated connectors to couple the associated modules shown in FIG. 24.

Storage system 200 establishes a PCIe mesh configuration using at least PCIe switches 221 and 232, and associated PCIe links. Each of the meshed elements is interconnected with a plurality of PCIe links which allow for failover in the case of a single module failure or removal, such as a failure or removal of any of octet 210, controller 230, or fabric module 220. During a single-module failure or removal, a "one-hop" worst-case PCIe latency is incurred. For example, if PCIe link 242 to fabric module 220 fails, then controller 230 can communicate with octet 310 over PCIe link 250 or through another controller or octet to fabric module 220.

Control element 215 includes one or more microprocessors or microcontrollers along with any associated storage memory. Control element 215 communicates with controller modules over Ethernet control plane links 248. Control element 215 can communicate with data storage sleds over PCIe links as well as sideband links 246 and 247 which can comprise Universal Serial Bus (USB) links or universal asynchronous receiver/transmitter (UART) serial links (such as RS-232 links), among others.

Control element 215 initializes data storage sleds 211. Control element 215 also accumulates statistical data and usage information for each storage sled 210 in storage system 200. Control element 215 can retrieve this statistical data or usage information over Ethernet links 248 from controller modules 230 or over USB sideband and UART sideband links 246 from data storage sleds 211. Ethernet links 248 are shown in FIG. 24, and these links represent many links which individually couple to each processing system in each controller module of assembly 200. Ethernet links 248 comprise a control plane, which can be used for transferring control information and status information between controller modules. I/O module 220 also provides expansion of the control plane to other 1 U enclosures for cluster control plane interconnect over Ethernet links.

Each processing system 231 communicates over one or more PCIe links 236 through PCIe switches 232/221 with external expansion cards or external PCIe ports. In some examples, the external network expansion cards include network interface cards for communicating over TCP/IP (Transmission Control Protocol (TCP)/Internet Protocol) networks or for carrying iSCSI (Internet Small Computer System Interface) or NVMe (Non-Volatile Memory Host Controller Interface Specification Express) traffic. These external network links 249 are provided by external network interfaces 244. External access to storage system 200 is provided over ones of packet network links 249 provided by external network interfaces 244, such as for end user access to data stored on storage sleds 211.

Each controller module 230 can also communicate with other controller modules, such as those in other storage assemblies, over one or more inter-module packet network interfaces 245. In some examples, module packet network interfaces 245 include network interface cards for communicating over Ethernet or TCP/IP networks for exchanging storage packets between controller modules. Ethernet control plane 248 can be carried over interfaces 245.

The PCIe switches discussed herein can comprise PCIe crosspoint switches, which logically interconnect various ones of the associated PCIe links based at least on the traffic carried by each PCIe link. In some examples, logical segregation of the PCIe fabric is achieved using non-transparent ports of the PCIe switches. Each PCIe switch port can be a non-transparent (NT) or transparent port. An NT port can allow some logical isolation between endpoints, much like a bridge, while a transparent port does not allow logical isolation, and has the effect of connecting endpoints in a purely switched configuration. Access over an NT port or ports can include additional handshaking between the PCIe switch and the initiating endpoint to select a particular NT port or to allow visibility through the NT port.

In other examples, logical segregation of the PCIe fabric is achieved using domain-based routing of the PCIe switches. A domain-based PCIe signaling distribution can be included in the PCIe switches which allows segregation of PCIe ports of a PCIe switch according to user-defined groups. These logical segregation or groups can be used to form the front-end and back-end data planes discussed herein, or can be used for establishing routing and redundancy among the various PCIe switches, forming a mesh fabric of PCIe traffic in system 200.

PCIe can support multiple bus widths, such as x1, x4, x8, x16, and x32, with each multiple of bus width comprising an additional "lane" for data transfer. PCIe also supports transfer of sideband signaling, such as System Management Bus (SMBus) interfaces and Joint Test Action Group (JTAG) interfaces, as well as associated clocks, power, and bootstrapping, among other signaling. Although PCIe is used in FIG. 24, it should be understood that different communication links or busses can instead be employed, such as NVMe, Ethernet, Serial Attached SCSI (SAS), FibreChannel, Thunderbolt, Serial Attached ATA Express (SATA Express), among other interconnect, network, and link interfaces. Any of the links in FIG. 24 can each use various communication media, such as air, space, metal, optical fiber, or some other signal propagation path, including combinations thereof. Any of the links in FIG. 24 can include any number of PCIe links or lane configurations. Any of the links in FIG. 24 can each be a direct link or might include various equipment, intermediate components, systems, and networks. Any of the links in FIG. 24 can each be a common link, shared link, aggregated link, or may be comprised of discrete, separate links.

In FIG. 24, any processing system 231 on any controller module 230 has logical visibility to all storage drives in all storage sleds 211 over the PCIe fabric. Any processing system 231 can transfer data for storage on any storage drive and retrieve data already stored on any storage drive. Thus, 'm' number of storage drives can be coupled with 'n' number of processors to allow for a large, scalable architecture with a high-level of redundancy and density.

To provide visibility of each processing system 231 to any storage sled 211, various techniques can be employed. In a first example, a particular processing system 231 manages (instantiates/binds) a subset number of the total quantity of storage sleds, such as 16 storage drives spanning 4 storage sleds, and handles transactions for that subset of storage drives, such as read and write transactions. Each processing system 231, however, has memory-mapped or routing-table based visibility to the storage drives managed by any other processing system 231 or processing systems in other storage assemblies. When a storage operation is desired for a storage drive not managed by a particular processing system, the particular processing system uses the memory mapped access or routing-table based visibility to direct the storage operation to the proper storage drive for that transaction. The transaction can be transferred and transitioned to the appropriate processing system that manages that storage drive associated with the data of the transaction. The PCIe fabric, through PCIe switches 232/221, or inter-module network interfaces 245 are used to transfer data between processing systems so that a particular processing system or processor can store the data in the storage sled or sleds that is managed by that particular processing system, even though the data might be received over a network interface associated with a different processing system.

In operation, such as a write operation, data can be received over portions of external network interfaces 244 by any processing system 231 of any controller module 230. For example, the write operation can be a write operation received over external network interfaces 244 from an end user employing an iSCSI protocol or NVMe protocol. The processing system that receives the write operation determines if it physically manages the storage drive or drives associated with the write operation, and if it does, then the processing system transfers the data for storage on the associated storage drives over a back end data plane of the PCIe fabric. If the processing system determines that it does not physically manage the storage drive or drives associated with the write operation, then the processing system transfers the write operation to another controller module that includes the processing system that does manage the storage drive or drives over either the front end PCIe data plane or over inter-module network interfaces 245. Data striping can be employed by any processing system to stripe data for a particular write transaction over any number of storage drives, such as over all of the storage sleds that include storage drives managed by the particular processing system.

In this example, the PCIe interfaces associated with each processing system 231 have 64-bit address spaces, which allows an addressable space of $2^{64}$ bytes, leading to at least 16 exbibytes of byte-addressable memory. The 64-bit PCIe address space can shared by all processing systems 231 for memory mapping to storage drives on storage sleds. Thus, while each particular processing system 231 actually manages a subset of the total storage drives on storage sleds, all processors 231 have visibility to, and can initiate read/write transactions to, any of storage drives on storage sleds. A managing processing system 231 that manages a particular storage drives on storage sleds receives write/read transactions and any associated data from an initiating processing system 231 by at least using a memory-mapped address space or routing table to establish which controller module handles storage operations for a particular set of storage sleds.

Figure 25:
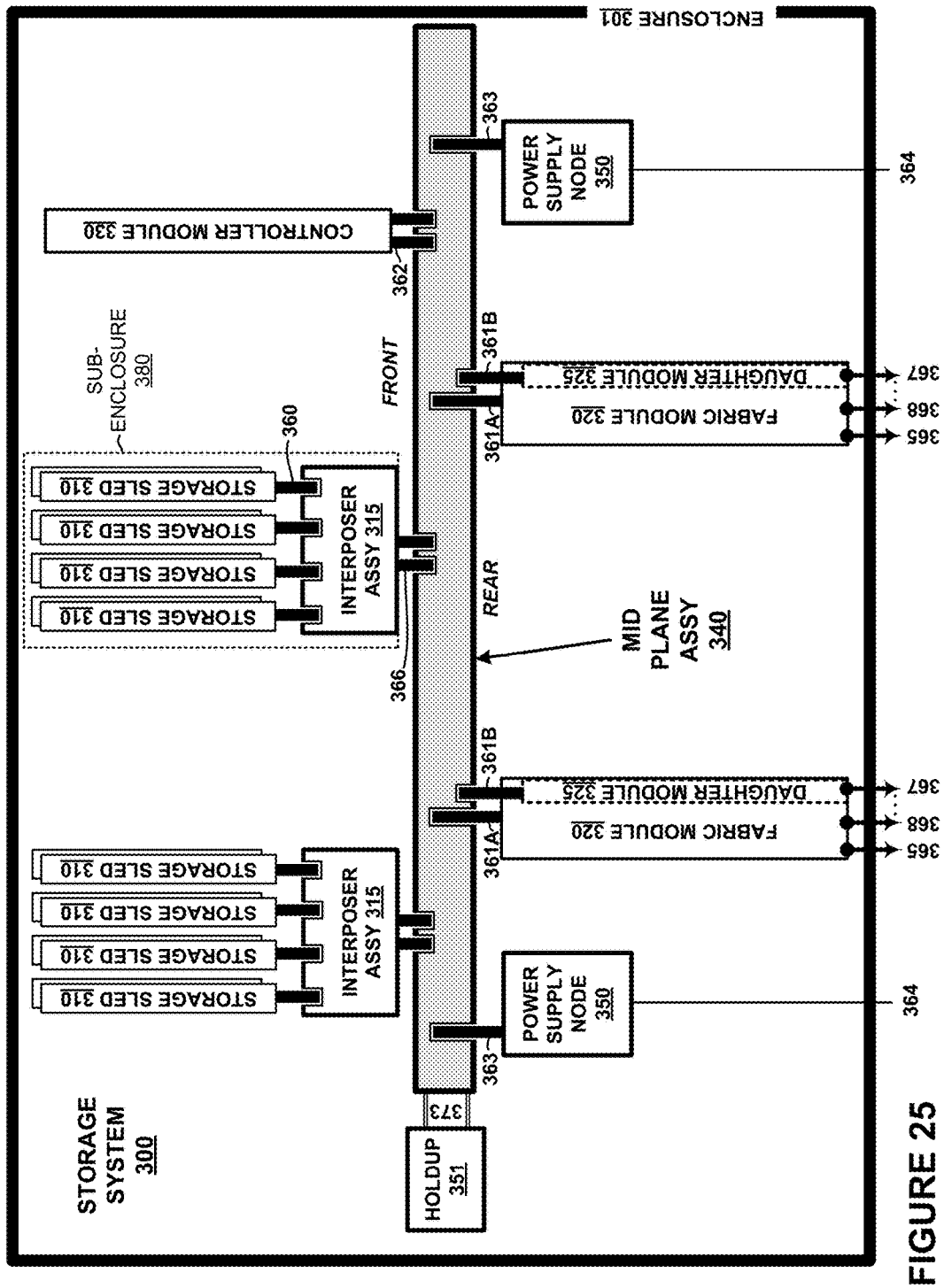
FIG. 25 is a block diagram illustrating a storage assembly.

FIG. 25 is a block diagram illustrating storage system 300. FIG. 25 is a block diagram illustrating the various modules of the previous figures as related to a midplane. The elements of FIG. 25 are shown as physically mated to midplane assembly 340. Midplane assembly 340 includes circuit board elements and a plurality of physical connectors for mating with any associated storage octets 380, fabric modules 320, daughter modules 325, controller modules 330, or power supply nodes 350. Midplane 340 comprises one or more printed circuit boards, connectors, physical support members, chassis elements, structural elements, and associated links as metallic traces or optical links for interconnecting the various elements of FIG. 25. Midplane 340 can function as a backplane, but instead of having sleds or modules mate on only one side as in single-ended backplane examples, midplane 340 has sleds or modules that mate on at least two sides, namely a front and rear. Elements of FIG.

25 can correspond to similar elements of the Figures herein, such as midplane assembly 190, although variations are possible.

FIG. 25 shows many elements included in a 1 U enclosure 301. The enclosure can instead be of any multiple of a standardized computer rack height, such as 1 U, 2 U, 3 U, 4 U, 5 U, 6 U, 7 U, and the like, and can include associated chassis, physical supports, cooling systems, mounting features, cases, and other enclosure elements. Typically, each sled or module will fit into associated slot or groove features included in a chassis portion of enclosure 301 to slide into a predetermined slot and guide a connector or connectors associated with each sled to mate with an associated connector or connectors on midplane 340. System 300 enables hot-swapping of any of the modules or sleds and can include other features such as power lights, activity indicators, external administration interfaces, and the like.

Storage sleds 310 each have an associated connector 360 which mates into a mating connector of an associated interposer assembly 315. Each interposer assembly 315 has associated connectors 366 which mate with one or more connectors on midplane 340. In this examples, up to eight storage sleds 310 can be inserted into a single interposer assembly 315 which subsequently mates to a plurality of connectors on midplane 340. These connectors can be a common or shared style/type which is used by controller modules 330 and connector 362. Additionally, each collection of storage sleds 310 and interposer assembly 315 can be included in a sub-assembly or sub-enclosure 380 which is insertable into midplane 340 in a modular fashion. Controller modules 330 each have an associated connector 362, which can be a similar type of connector as interposer assembly 315. In some examples, such as in the examples above, controller modules 330 each plug into more than one mating connector on midplane 340.

Fabric modules 320 couple to midplane 340 via connector 361A and provide cluster-wide access to the storage and processing components of system 300 over cluster interconnect links 365. Fabric modules 320 provides control plane access between controller modules of other 1 U systems over control plane links 368. In operation, fabric modules 320 each are communicatively coupled over a PCIe mesh via link 361A and midplane 340 with controller modules 330 and storage sleds 310, such as pictured in FIG. 25.

Daughter modules 325 couple to midplane 340 via connector 361B and provide external access to the storage and processing components of system 300, such as for host systems, end user devices, or external systems. In operation, daughter modules 325 each are communicatively coupled over a PCIe mesh via link 361B and midplane 340 with controller modules 330 and storage sleds 310, such as pictured in FIG. 25. Daughter modules 325 each nest into an associated fabric module 320, as discussed above for module 150 and in FIG. 16.

Cluster interconnect links 365 are employed to interconnect 1 U enclosures between each other using PCIe links and Ethernet links, such as interconnecting controller modules 330 plugged into other midplanes of other assemblies. Cluster interconnect links 365 can comprise PCIe links or other links and connectors. The PCIe links used for external interconnect can terminate at external connectors, such as mini-SAS or mini-SAS HD jacks or connectors which are employed to carry PCIe signaling over mini-SAS cabling. In further examples, mini-SAS HD cables are employed that drive 12 Gb/s versus 6 Gb/s of standard SAS cables. 12 Gb/s can support PCIe Gen 3. Quad (4-channel) Small Form-factor Pluggable (QSFP or QSFP+) connectors or jacks can be employed as well for carrying PCIe signaling.

Control plane links 368 can comprise Ethernet links for carrying control plane communications. Associated Ethernet jacks can support 10 Gigabit Ethernet (10 GbE), among other throughputs. Further external interfaces provided over links 368 can include PCIe connections, FiberChannel connections, administrative console connections, sideband interfaces such as USB, RS-232, video interfaces such as video graphics array (VGA), high-density media interface (HDMI), digital video interface (DVI), among others, such as keyboard/mouse connections.

External links 367 can comprise network links provided by daughter modules 325, which can comprise Ethernet, TCP/IP, Infiniband, iSCSI, or other external interfaces. External links 367 can comprise links for communicating with external systems, such as host systems, management systems, end user devices, Internet systems, packet networks, servers, or other computing systems, including other enclosures similar to system 300. External links 367 can comprise Quad Small Form Factor Pluggable (QSFFP) or Quad (4-channel) Small Form-factor Pluggable (QSFP or QSFP+) jacks carrying at least 40 GbE signaling.

In some examples, system 300 includes case or enclosure elements, chassis, and midplane assemblies that can accommodate a flexible configuration and arrangement of sleds and associated circuit cards. Although FIG. 25 illustrates storage sleds mating and controller modules on a first side of midplane assembly 340 and various modules mating on a second side of midplane assembly 340, it should be understood that other configurations are possible. System 300 can include a chassis to accommodate any of the following configurations, either in front-loaded or rear-loaded configurations:

storage modules that contain multiple SSDs each
modules containing HHHL cards (half-height half-length PCIe cards) or FHHL cards (full-height half-length PCIe cards), that can comprise graphics cards or graphics processing units (GPUs), PCIe storage cards, PCIe network adaptors, or host bus adaptors
modules with PCIe cards (full-height full-length PCIe cards) that comprise controller modules, which can comprise NVIDIA Tesla or Intel Phi processor cards
modules containing 2.5-inch PCIe SSDs
cross-connect modules, interposer modules, and control elements Additionally, power and associated power control signaling for the various sleds of system 300 is provided by one or more power supply nodes 350 over associated links 363, which can comprise one or more links of different voltage levels, such as +12 VDC or +5 VDC, among others. Although power supply nodes 350 are shown as included in system 300 in FIG. 25, it should be understood that power supply nodes 350 can instead be included in separate enclosures, such as separate 1 U enclosures. Each power supply node 350 also includes power link 364 for receiving power from power sources, such as AC or DC input power.

Additionally, power holdup circuitry can be included in holdup modules 351 which can deliver holdup power over links 373 responsive to power loss in link 364 or from a failure of power supply nodes 350. Power holdup circuitry can also be included on each sled or module. This power holdup circuitry can be used to provide interim power to the associated sled or module during power interruptions, such as when main input or system power is lost from a power source. Additionally, during use of holdup power, processing portions of each sled or module can be employed to selectively power down portions of each sled according to usage statistics, among other considerations. This holdup circuitry can provide enough power to commit in-flight write data during power interruptions or power loss events. These power interruption and power loss events can include loss of power from a power source, or can include removal of a sled or module from an associated socket or connector on midplane 340. The holdup circuitry can include capacitor arrays, super-capacitors, ultra-capacitors, batteries, fuel cells, flywheels, or other energy storage components, along with any associated power control, conversion, regulation, and monitoring circuitry.

Figure 26:
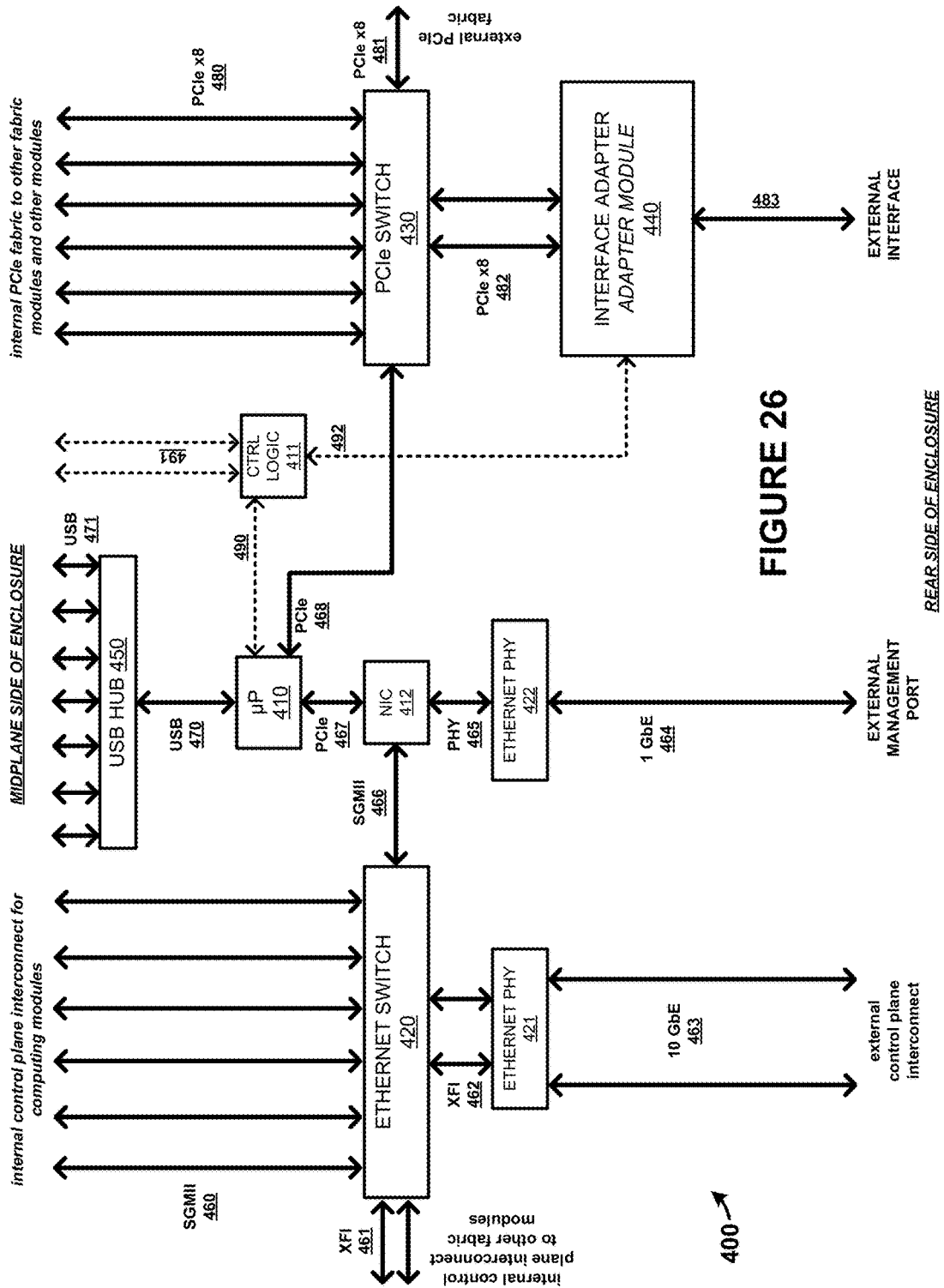
FIG. 26 is a block diagram illustrating an interface assembly.

FIG. 26 illustrates fabric system 400 which can be an example implementation of elements of fabric module 140. System 400 includes microprocessor (μP) 410, control logic 411, network interface card (NIC) 412, Ethernet switch 420, Ethernet PHY 421, Ethernet physical interface circuitry (PHY) 422, PCIe switch 430, interface adapter adapter module 440, and USB hub 450. These elements are interconnected by various links shown in FIG. 26, namely links 460-468, 470-471, 480-483, and 490-491.

Interface adapter module 440 comprises a removable daughter module, such as network module 1800 that fits into a modular bay of fabric module 140. Module 440 can comprise a network interface card that provides one or more external Ethernet interfaces, such as 40 gigabit Ethernet, among other interfaces and bandwidths. Module 440 couples over PCIe x8 links 482 to PCIe switch 430, that further couples to a PCIe mesh/interconnect via ones of PCIe x8 links 480.

PCIe switch 430 provides a PCIe fabric for communicatively coupling fabric system 400 into a mesh architecture provided by a midplane and for communicatively coupling together further instances of fabric module 400 in an enclosure. PCIe switch 430 also provides for external interconnect over PCIe x8 links 481 for coupling a data storage system associated with fabric system 400 to other data storage systems, such as coupling one enclosure or chassis to another enclosure or chassis within a clustered rackmount environment over PCIe links. PCIe switch 430 also couples to μP 410 which handles various control and command functions for PCIe switch 430, such as controlling link apportionment, link enablement, switch partitioning, or other features of PCIe switch 430.

Ethernet switch 420 provides for fanned out Ethernet links among various control or computing modules of a computing/data system over links 460 and provides for extension of the control plane Ethernet of further instances of fabric module 400 in an enclosure over links 461. Furthermore, through Ethernet PHY 421, Ethernet switch 420 can provide Ethernet interconnect of the control plane for coupling a data storage system associated with fabric system 400 to other data storage systems.

USB hub 450 comprises USB hub circuitry configured to provide fanned-out USB links 471 for control and command communications among a data storage system, such as for initialization or sideband signaling.

To control various aspects of the elements of system 400 as well as for control, monitoring, telemetry, and initialization of an associated data storage system that includes system 400, μP 410 is provided. μP 410 is communicatively coupled to Ethernet switch 420, USB hub 450, PCIe switch 430, and to external management ports. The external management ports allow for administrator access and control of system 400 and associated data systems over link 464 provided by Ethernet PHY 422 and NIC 412. Control logic 411 can provide for sideband signaling, telemetry monitoring of various sensors distributed among a data storage system, power supply monitoring and control, fan or cooling system control, module insertion monitoring, or other sideband and specialized signaling over links 490-492. This information can be provided to μP 410 for further monitoring, collection, and user/administrator visibility to the operations of system 400 and associated data storage systems.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents. For example, although PCIe links and interfaces are discussed herein, it should be understood that other high-speed point-to-point computer expansion bus standards could be employed.

What is claimed is:

1. A rackmount assembly, comprising:
   one or more storage modules each comprising at least one storage drive;
   one or more controller modules each comprising at least one processing system;
   one or more fabric modules each comprising at least one cluster cross-connect Peripheral Component Interconnect Express (PCIe) switch configured to couple to at least one further rackmount assembly;
   first interconnect PCIe links that couple each of the one or more storage modules to each of the one or more controller modules and each of the one or more fabric modules;
   second interconnect PCIe links that couple each of the one or more controller modules to each of the one or more fabric modules;
   third interconnect PCIe links that couple the one or more controller modules to each other;
   the one or more fabric modules each configured to receive storage operations directed to ones of the storage modules over at least one external interface of the rackmount assembly and transfer the storage operations for handling by ones of the controller modules.

2. The rackmount assembly of claim 1, comprising:
   a first controller module configured to transfer a first storage operation for delivery to a first storage module over a pathway selected from among the second interconnect PCIe links and the third interconnect PCIe links.

3. The rackmount assembly of claim 1, comprising:
   the one or more fabric modules each housing a daughter module removable from the associated fabric module and comprising a network interface module configured to receive at least a portion of the storage operations.

4. The rackmount assembly of claim 1, comprising:
   a chassis with a plurality of modular bays configured to interchangeably house the one or more storage modules and the one or more controller modules.

5. The rackmount assembly of claim 1, comprising:
   a midplane element comprising mating connectors for coupling to the one or more storage modules, the one or more controller modules, and the one or more fabric modules;

the midplane element comprising the first interconnect PCIe links, second interconnect PCIe links, and third interconnect PCIe links.

6. The rackmount assembly of claim 5, comprising:
the midplane element comprising at least one power connector configured to couple to at least one power supply module that provides power to the rackmount assembly from a power source;
the midplane element comprising power links configured to direct power supplied from the at least one power supply module to the one or more storage modules, the one or more controller modules, and the one or more fabric modules.

7. The rackmount assembly of claim 6, comprising:
the midplane element comprising a first printed circuit board and a tiered feature comprising an adjunct printed circuit board mated to the first printed circuit board to form a power tail, the power tail configured to establish a high current coupling of the at least one power supply module to the midplane element sufficient to supply power to modules of the rackmount assembly.

8. The rackmount assembly of claim 1, comprising:
a chassis with a plurality of modular front bays configured to interchangeably house the one or more storage modules and the one or more controller modules, and a plurality of modular rear bays configured to house the one or more fabric modules;
a midplane element comprising mating connectors for coupling to the one or more storage modules, the one or more controller modules, and the one or more fabric modules;
the midplane element comprising the first interconnect PCIe links, second interconnect PCIe links, and third interconnect PCIe links.

9. The rackmount assembly of claim 8, comprising:
one or more fan modules mounted into apertures of the midplane element and positioned between the modular front bays and the modular rear bays, with the one or more fan modules configured to provide airflow to the rackmount assembly.

10. The rackmount assembly of claim 9, comprising:
a telescoping rail system coupled to the chassis and configured to mount the rackmount assembly in a rackmount and telescopically extend to move the rackmount assembly outward from the rackmount for accessing the one or more fan modules without removal of the data storage system from the rackmount.

11. A meshed computing architecture, comprising:
a midplane comprising a Peripheral Component Interconnect Express (PCIe) interconnect;
one or more storage modules that couple to a first portion of the PCIe interconnect;
one or more controller modules that couple to a second portion of the PCIe interconnect;
one or more fabric modules that couple to a third portion of the PCIe interconnect;
wherein the first portion of the PCIe interconnect communicatively couples each of the one or more storage modules to each of the one or more controller modules and each of the one or more fabric modules;
wherein the second portion of the PCIe interconnect communicatively couples each of the one or more controller modules to each of the one or more fabric modules;
wherein the third portion of the PCIe interconnect communicatively couples the one or more controller modules to each other.

12. The meshed computing architecture of claim 11,
wherein the one or more storage modules each comprise at least one storage drive;
wherein the one or more controller modules each comprise at least one processing system;
wherein the one or more fabric modules each comprise at least one cluster cross-connect PCIe switch configured to couple to at least one fabric module associated with computing assemblies of a data cluster; and
wherein the one or more fabric modules each are each configured to receive storage operations over at least one network interface that are directed to ones of the storage modules, and transfer the storage operations over the second portion of the PCIe interconnect for handling by ones of the controller modules.

13. The meshed computing architecture of claim 12, wherein the one or more fabric modules each comprise a daughter module removable from the associated fabric module that comprises the network interface configured to receive the storage operations for handling by the meshed computing architecture.

14. The meshed computing architecture of claim 11, comprising:
a first controller module configured to transfer a first storage operation for delivery to a first storage module over a pathway selected from among the second portion of the PCIe interconnect and the third portion of the PCIe interconnect.

15. The meshed computing architecture of claim 11, comprising:
wherein the one or more fabric modules each are each configured to receive storage operations that are directed to ones of the storage modules over at least one host network interface, and transfer the storage operations over the second portion of the PCIe interconnect for handling by ones of the controller modules; and
wherein the one or more fabric modules each are each configured to exchange control plane network traffic between ones of the controller modules.

16. The meshed computing architecture of claim 11,
wherein the one or more storage modules are configured to couple to the first portion of the PCIe interconnect via associated modular front bay connectors of the midplane;
wherein one or more controller modules are configured to couple to the second portion of the PCIe interconnect via associated modular front bay connectors of the midplane;
wherein one or more fabric modules are configured to couple to the third portion of the PCIe interconnect via associated modular rear bay connectors of the midplane; and
wherein at least the midplane, the one or more storage modules, the one or more controller modules, and the one or more fabric modules are housed by a chassis with the modular front bays configured to interchangeably house the one or more storage modules and the one or more controller modules, and the modular rear bays configured to interchangeably house the one or more fabric modules.

17. The meshed computing architecture of claim 11, comprising:

the midplane comprising at least one power connector configured to couple to at least one power supply module that provides power from a power source;

the midplane comprising power links configured to direct power supplied from the at least one power supply module to the one or more storage modules, the one or more controller modules, and the one or more fabric modules.

18. The meshed computing architecture of claim 17, comprising:

the midplane comprising a first printed circuit board and a tiered feature comprising an adjunct printed circuit board mated to the first printed circuit board to form a power tail, the power tail configured to establish a high current coupling of the at least one power supply module to the midplane sufficient to supply power to at least the one or more storage modules, the one or more controller modules, and the one or more fabric modules.

19. A data storage assembly, comprising:

a midplane assembly configured to:

electrically couple on a front side to a plurality of storage modules;

electrically couple on the front side to a plurality of controller modules;

electrically couple on a rear side opposite the front side to a plurality of interconnect modules;

electrically couple on a rear side to one or more power supply modules using a tiered printed circuit board configuration;

electrically interconnect ones of the plurality of storage modules, the plurality of controller modules, and the plurality of interconnect modules;

receive power from the one or more power supply modules and distribute the power to the plurality of storage modules, the plurality of controller modules, and the plurality of interconnect modules; and a chassis configured to:

mechanically house and structurally support each of the plurality of storage modules, the plurality of controller modules, the plurality of interconnect modules, and the one or more power supply modules when coupled to the midplane assembly to form the data storage assembly and allow installation of the data storage assembly into a rackmount environment.

20. The data storage assembly of claim 19, further comprising:

one or more fan modules mounted between a front side of modules formed by the plurality of storage modules and the plurality of controller modules, and a rear side of modules formed by the plurality of interconnect modules and the one or more power supply modules, with the one or more fan modules configured to provide airflow to the data storage assembly.

* * * * *